(12) United States Patent
Stoica et al.

(10) Patent No.: US 9,831,873 B2
(45) Date of Patent: Nov. 28, 2017

(54) METHOD AND APPARATUS FOR SIMULTANEOUS PROCESSING OF MULTIPLE FUNCTIONS

(71) Applicant: California Institute of Technology, Pasadena, CA (US)

(72) Inventors: Adrian Stoica, Altadena, CA (US); Radu Andrei, Shelby Township, MI (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 14/618,953

(22) Filed: Feb. 10, 2015

(65) Prior Publication Data

US 2016/0233862 A1    Aug. 11, 2016
US 2017/0244410 A9    Aug. 24, 2017

Related U.S. Application Data

(60) Division of application No. 13/235,188, filed on Sep. 16, 2011, now Pat. No. 8,975,922, which is a continuation-in-part of application No. 12/393,562, filed on Feb. 26, 2009, now abandoned.

(60) Provisional application No. 61/383,488, filed on Sep. 16, 2010, provisional application No. 61/067,666, filed on Feb. 29, 2008.

(51) Int. Cl.
| | |
|---|---|
| *H03K 19/20* | (2006.01) |
| *H03K 19/00* | (2006.01) |
| *G06F 7/00* | (2006.01) |
| *G06F 7/49* | (2006.01) |
| *H03K 19/08* | (2006.01) |

(52) U.S. Cl.
CPC .......... *H03K 19/0002* (2013.01); *G06F 7/00* (2013.01); *G06F 7/49* (2013.01); *H03K 19/08* (2013.01)

(58) Field of Classification Search
CPC ...... H03K 19/0002; H03K 19/08; G06F 7/00; G06F 7/49
USPC .......................................... 326/105, 59, 106
See application file for complete search history.

(56) References Cited

U.S. PATENT DOCUMENTS

| | | | | |
|---|---|---|---|---|
| 4,275,265 | A | * | 6/1981 | Davida ................. H04L 9/0618 380/29 |
| 4,463,344 | A | | 7/1984 | Adler et al. |
| 4,706,299 | A | * | 11/1987 | Jorgensen ................. G06E 1/04 326/60 |
| 5,650,783 | A | | 7/1997 | Murashita et al. |
| 6,133,754 | A | | 10/2000 | Olson |
| 7,088,141 | B2 | | 8/2006 | Deogun et al. |
| 7,221,711 | B2 | | 5/2007 | Woodworth et al. |

(Continued)

*Primary Examiner* — Daniel D Chang
(74) *Attorney, Agent, or Firm* — KPPB LLP

(57) ABSTRACT

Electronic logic gates that operate using N logic state levels, where N is greater than 2, and methods of operating such gates. The electronic logic gates operate according to truth tables. At least two input signals each having a logic state that can range over more than two logic states are provided to the logic gates. The logic gates each provide an output signal that can have one of N logic states. Examples of gates described include NAND/NAND gates having two inputs A and B and NAND/NAND gates having three inputs A, B, and C, where A, B and C can take any of four logic states. Systems using such gates are described, and their operation illustrated. Optical logic gates that operate using N logic state levels are also described.

13 Claims, 26 Drawing Sheets

(56) References Cited

U.S. PATENT DOCUMENTS

| | | |
|---|---|---|
| 7,339,500 B2 | 3/2008 | Noda et al. |
| 7,502,464 B2 * | 3/2009 | Macchetti ............ H04L 9/0631 380/29 |
| 8,975,922 B2 | 3/2015 | Stoica et al. |
| 2005/0030207 A1 | 2/2005 | Craven et al. |
| 2005/0258863 A1 | 11/2005 | Chang et al. |
| 2007/0152710 A1 | 7/2007 | Lablans |
| 2007/0176800 A1 | 8/2007 | Rijavec et al. |
| 2008/0088345 A1 | 4/2008 | Whetsel |
| 2008/0094260 A1 | 4/2008 | Motoyama et al. |
| 2008/0212776 A1 | 9/2008 | Motoyama et al. |
| 2012/0236378 A1 | 9/2012 | Stoica et al. |

\* cited by examiner

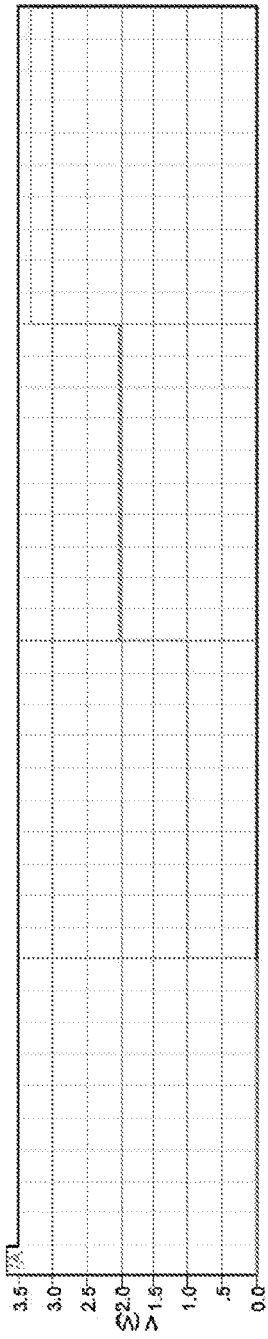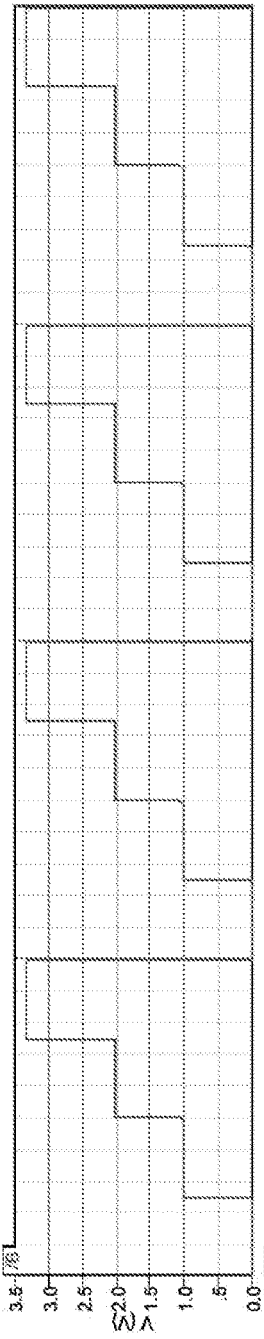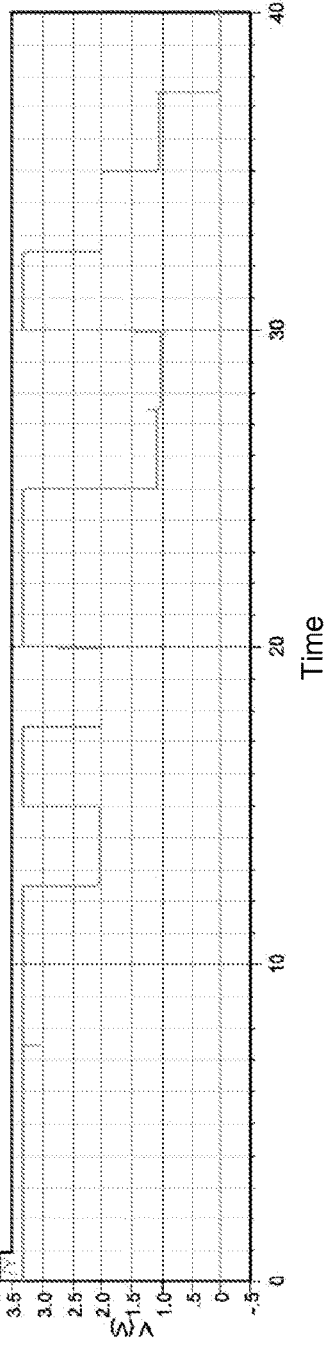
FIG. 7A
FIG. 7B
FIG. 7C

FIG. 8A    FIG. 8B    FIG. 8C
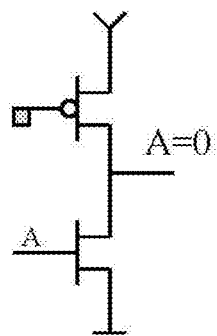
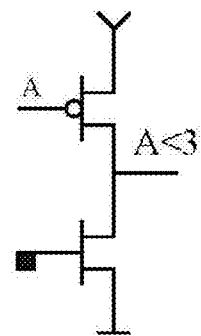
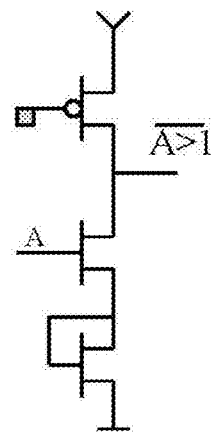
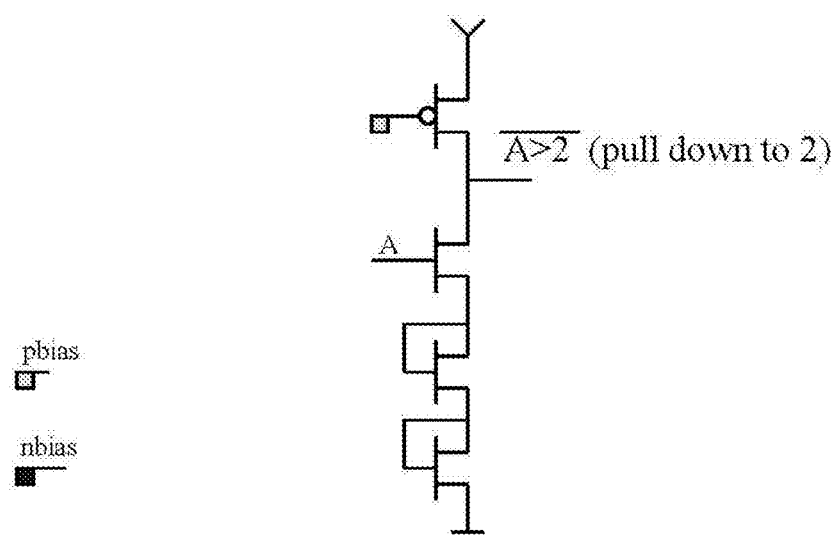
FIG. 8D

| Selection | | | | Active High Data | |
|---|---|---|---|---|---|
| | | | | M = H | M = L; |
| S3 | S2 | S1 | S0 | Logic Functions | $C_n$ = H (no carry) |
| L | L | L | L | $F = \overline{A}$ | $F = A$ |
| L | L | L | H | $F = \overline{A + B}$ | $F = A + B$ |
| L | L | H | L | $F = \overline{A}B$ | $F = A + \overline{B}$ |
| L | L | H | H | $F = 0$ | $F$ = Minus 1 (2's Compl) |
| L | H | L | L | $F = \overline{AB}$ | $F = A$ Plus $A\overline{B}$ |
| L | H | L | H | $F = \overline{B}$ | $F = (A + B)$ Plus $A\overline{B}$ |
| L | H | H | L | $F = A \oplus B$ | $F = A$ Minus $B$ Minus 1 |
| L | H | H | H | $F = A\overline{B}$ | $F = A\overline{B}$ Minus 1 |
| H | L | L | L | $F = \overline{A} + B$ | $F = A$ Plus $AB$ |
| H | L | L | H | $F = \overline{A \oplus B}$ | $F = A$ Plus $B$ |
| H | L | H | L | $F = B$ | $F = (A + \overline{B})$ Plus $AB$ |
| H | L | H | H | $F = AB$ | $F = AB$ Minus 1 |
| H | H | L | L | $F = 1$ | $F = A$ Plus $A$* |
| H | H | L | H | $F = A + \overline{B}$ | $F = (A + B)$ Plus $A$ |
| H | H | H | L | $F = A + B$ | $F = (A + \overline{B})$ Plus $A$ |
| H | H | H | H | $F = A$ | $F = A$ Minus 1 |

FIG. 19

METHOD AND APPARATUS FOR SIMULTANEOUS PROCESSING OF MULTIPLE FUNCTIONS

CROSS-REFERENCE TO RELATED APPLICATIONS

This application is a Divisional application of co-pending U.S. patent application Ser. No. 13/235,188 filed Sep. 16, 2011, which application claimed priority to and the benefit of then U.S. provisional patent application Ser. No. 61/383,488 filed Sep. 16, 2010, and was a continuation-in-part of co-pending U.S. patent application Ser. No. 12/393,562, filed Feb. 26, 2009, which application claimed the priority and benefit of U.S. provisional patent application Ser. No. 61/067,666 filed Feb. 29, 2008, each of which applications is incorporated herein by reference in its entirety.

STATEMENT REGARDING FEDERALLY FUNDED RESEARCH OR DEVELOPMENT

The invention claimed herein was made in the performance of work under a NASA contract, and is subject to the provisions of Public Law 96-517 (35 USC 202) in which the Contractor has elected to retain title.

FIELD OF THE INVENTION

The invention relates to electronic logic gates.

BACKGROUND OF THE INVENTION

A substantial amount of research in electronic microsystems has focused on bringing more computing power to smaller devices. Traditional approaches to increase computing bandwidth has often focused on exploiting concurrency, such as by allocating increasingly more gates to specific tasks, or by performing instructions faster, such as operating gates at higher speeds. These traditional approaches are expected to have diminishing returns, and may bump up against technological barriers, such as for example limitations on power dissipation.

Another technological barrier has to do with the substantial increase in the number of transistors built in modern devices, which increases by approximately a factor of two every 18 to 24 months, and which is predicted by Moore's Law. As the number of devices increases, more and more area on a chip needs to be devoted to interconnects. At some point, the portion of the chip devoted to interconnects becomes excessive, possibly exceeding the area of the chip devoted to transistors or active devices.

Also known in the prior art is Adler et al., U.S. Pat. No. 4,463,344, issued Jul. 31, 1984, which is said to disclose an algorithm and the hardware embodiment for producing a run length limited code useful in magnetic recording channels. The system described produces sequences which have a minimum of 2 zeros and a maximum of 7 zeros between adjacent 1's. The code is generated by a sequential scheme that maps 1 bit of unconstrained into 2 bits of constrained data. The encoder is a finite state machine whose internal state description requires 3 bits. It possesses the attractive feature of reset data blocks which reset it to a fixed state. The decoder requires a lookahead of three future channel symbols (6 bits) and its operation is channel state independent. The error propagation due to a random error is 3 bits. The hardware implementation is extremely simple and can operate at very high data speeds.

Also known in the prior art is Deogun et al., U.S. Pat. No. 7,088,141, issued Aug. 8, 2006, which is said to disclose a multi-threshold complementary metal-oxide semiconductor (MTCMO) bus circuit reduces bus power consumption via a reduced circuit leakage standby and pulsed control of standby mode so that the advantages of MTCMOS repeater design are realized in dynamic operation. A pulse generator pulses the high-threshold voltage power supply rail standby switching devices in response to changes detected at the bus circuit inputs. The delay penalty associated with leaving the standby mode is overcome by reducing cross-talk induced delay via a cross-talk noise minimization encoding and decoding scheme. A subgroup of bus wires is encoded and decoded, simplifying the encoding, decoding and change detection logic and results in the bus subgroup being taken out of standby mode only when changes occur in one or more of the subgroup inputs, further reducing the power consumption of the overall bus circuit.

Also known in the prior art is Rijavec, U.S. Patent Application Publication No. 2007/0176800 A1, published Aug. 2, 2007, which is said to disclose methods and systems for improving performance of data decoding using a priori information about the data steam. In one aspect a decoder may determine the degree of lossiness inherent in the data or in the application of the data as a maximum resolution of data to be decoded and may thereby streamline entropy decoding of the data. For example, in DCT-based image data compression coupled with Huffman or other entropy encoding, a priori data may be analyzed to determine the maximum required resolution in bits of the DCT encoded data so as to simplify the entropy decoding. Other aspects optimize DCT decoding computation with faster approximations where the quantization values indicate a higher degree of lossiness or noise in the DCT encoded data. A priori information may generally comprise values in the quantization table of a DCT encoded image and may be analyzed to determine the maximum symbol size and/or degree of lossiness.

Also known in the prior art is Noda, U.S. Pat. No. 7,339,500, issued Mar. 4, 2008, which is said to disclose two different block codes that can be encoded by one-type of encoding section. A first-point-fixed encoding section divides m-bit data into a first-half code and a second-half code, and encodes them into an n-bit provisional code with fixed start-point state. A code A/B counter receives a reset-signal and outputs a code selection signal to a code-order reversing section and a top-code correction section. The code-order reversing section receives a codeword excluding the top code from the start-point-fixed encoding section; and outputs the codeword as is, when the code selection signal indicates a code B, and reverses the order of the codeword to generate a new codeword, and outputs the new codeword to a latch, when the code selection signal indicates a code A. The top-code correction section determines whether the top code needs to be modified, and modifies the top code, if necessary.

Also known in the prior art is Motoyama, U.S. Patent Application Publication No. 2008/0094260 A1, published Apr. 24, 2008, which is said to disclose a logic circuit that executes a prescribed arithmetic processing that includes a decoder that converts one or more binary input data into a first plurality of bit data of a constant hamming weight regardless of a hamming weight of the input data, an interconnect network that is connected to the decoder, changes a bit pattern of the first plurality of bit data and generates a second plurality of bit data, according to receiving the first plurality of bit data converted according to the decoder, and substituting a bit position of the received first plurality of bit data for the purpose of the prescribed arithmetic operation, and an encoder connected to the interconnect network and converts the second plurality of bit data generated in the interconnect network into one or more binary output data.

Also known in the prior art is Motoyama, U.S. Patent Application Publication No. 2008/0212776 A1, published Sep. 4, 2008, which is said to disclose an encryption processing circuit that includes a decoder configured to convert a binary input data used for predetermined encryption computing into a first plurality of bit data of a constant hamming weight independently of a hamming weight of the input data; a wiring network configured to receive the first plurality of bit data converted by the decoder, the wiring network further configured, for the purpose of the predetermined encryption computing, to change a bit pattern of the received first plurality of bit data by replacing bit positions of the first plurality of bit data, and to generate a second plurality of bit data; and an encoder configured to convert the second plurality of bit data generated in the wiring network into a binary output data.

Mechanical computation systems that rely on a plurality of states, including machines that operate using N=10 states, such as Babbage's Difference Engine, have been known for many years. However, electronic computation systems use two states (e.g., binary logic).

There is a need for electronic logic gates and electronic computational systems that use more logic states than two binary logic states.

SUMMARY OF THE INVENTION

According to one aspect, the invention features an electronic logic gate. The electronic logic gate comprises at least a first input terminal and a second input terminal, each input terminal configured to receive a respective electrical input logic signal having one logic state selected from a number N of logic states, and an output terminal configured to provide an electrical output logic signal having one logic state selected from a number N of logic states, where N is an integer greater than two; the electronic logic gate configured to perform a logic operation using the electrical input logic signals received at the at least the first input terminal and the second input terminal, the logic operation defined by a truth table.

In one embodiment, the electronic logic gate further comprises a selector input configured to receive a selector signal having a plurality of logic states, the logic gate configured to perform a plurality of different logic functions using the electrical input logic signals received at the at least the first input terminal and the second input terminal in response to the selector signal.

In another embodiment, the truth table is a NAND/NAND truth table.

In yet another embodiment, the truth table is a NOR/NOR truth table.

In still another embodiment, the truth table is an OR/OR truth table.

In a further embodiment, the truth table is an XOR/XOR truth table.

In yet a further embodiment, the truth table is a NOT/NOT truth table.

In an additional embodiment, the truth table is an AND/AND truth table.

In one more embodiment, the N logic states correspond to N monotonic logic signal levels.

In one embodiment, the electronic logic gate further comprises a binary to N logic level encoder.

In another embodiment, the electronic logic gate further comprises an N logic level driver.

In yet another embodiment, the electronic logic gate further comprises an N logic level to binary decoder.

In still a further embodiment, the N monotonic logic signal levels are equally spaced signal levels.

According to another aspect, the invention relates to a method of processing electronic signals.

The method comprises the steps of: providing an electronic logic gate; providing a truth table; applying at least first and second electrical input logic signals each having one logic state selected from a number N of logic states to the at least the first input terminal and the second input terminal; sensing the electrical output signal; and performing at least one of recording the result, transmitting the result to a data handling system, or to displaying the result to a user. The electronic logic gate, comprises at least a first input terminal and a second input terminal, each input terminal configured to receive a respective electrical input logic signal having one logic state selected from a number N of logic states, and an output terminal configured to provide an electrical output logic signal having one logic state selected from a number N of logic states, where N is an integer greater than two; the electronic logic gate configured to perform a logic operation using the electrical input logic signals received at the at least the first input terminal and the second input terminal, the logic operation is defined by a truth table.

In one embodiment, the truth table is selected from the group of truth tables consisting of a NAND/NAND truth table, a NOR/NOR truth table, an OR/OR truth table, an XOR/XOR truth table, a NOT/NOT truth table, and an AND/AND truth table.

In another embodiment, the number N of logic states correspond to N monotonic logic signal levels.

In yet another embodiment, the N monotonic logic signal levels are equally spaced signal levels.

In a further aspect, the invention provides an optical logic gate. The optical logic gate comprises at least a first input terminal and a second input terminal, each input terminal configured to receive a respective optical input logic signal having one logic state selected from a number N of logic states, and an output terminal configured to provide an optical output logic signal having one logic state selected from a number N of logic states, where N is an integer greater than two; said optical logic gate configured to perform a logic operation using said optical input logic signals received at said at least said first input terminal and said second input terminal, said logic operation defined by a truth table.

In one embodiment, the optical logic gate further comprises a selector input configured to receive a selector signal having a plurality of logic states, said logic gate configured to perform a plurality of different logic functions using said optical input logic signals received at said at least said first input terminal and said second input terminal in response to said selector signal.

In another embodiment, said N logic states correspond to N monotonic logic signal levels.

The disclosed subject matter describes a method to provide an input-output relationship to process K input multi-level logic signals into an output signal. The method comprises the steps of choosing a decoding scheme to decode the K input multi-level logic signals into a set of M' bits on each channel of M channels; choosing Boolean functions for each channel; and choosing an encoding scheme to encode the output of the Boolean functions into the output signal.

In one embodiment, M'=M.

In another embodiment, the decoding scheme applies the same decoding function to each of the K input multi-level logic signals.

The disclosed subject matter describes a logic gate to provide an output signal y in response to K input signals $x_k$, k=1, 2, ..., K. The logic gate comprises M channels $C_m$, m=1, 2, ..., M to propagate data signals to perform M Boolean functions $f_m$, m=1, 2, ..., M, where for each k=1, 2, ..., K, input signal $x_k$ maps into an M'-tuple of bits $(x_k(M'), x_k(M'-1), ..., x_k(2), x_k(1))$, where each $x_k(m)$ is a binary logic signal, where a subset of the set of K M'-tuples $\{(x_k(M'), x_k(M'-1), ..., x_k(2), x_k(1)), k=1, 2, ..., K\}$ is transmitted over the M channels, and where the output signal y is a function of the M-tuple of binary signals $(f_M\{C_M\}, f_{M-1}\{C_{M-1}\}, f_2\{C_2\}, f_1\{C_1\})$, where for each m=1, 2, ..., M, $\{C_m\}$ is the subset of the set of K M'-tuples $\{(x_k(M'), x_k(M'-1), ..., x_k(2), x_k(1)), k=1, 2, ..., K\}$ that is transmitted over the channel $C_m$, and $f_m\{_m\}$ is an output of Boolean function $f_m$ for the set of binary logic signals $\{C_m\}$. The input signals can be multi-level logic signals.

In one embodiment, M'=M, where for each k=1, 2, ..., K, $x_k(m)$ is sent over channel $C_m$ for each m=1, 2, ..., M, where for each m=1, 2, ..., M, $\{C_m\}$ is the set of binary logic signals $\{x_1(m), x_2(m), ..., x_K(m)\}$.

In yet another embodiment, a same mapping is applied to each signal $x_k$.

The disclosed subject matter describes a method to synthesize a simul-gate logic circuit given a logic circuit comprising a set of Boolean logic gates $\{B_i, i=1, 2, ..., N\}$. The method comprises the steps of replacing, for each i=1, 2, ..., N, the Boolean logic gate $B_i$ in the logic circuit with the simul-gate $(B_i, B_i, ..., B_i)$, where $B_i$ is repeated M times.

In one embodiment, for each i=1, 2, ..., N, the simul-gate $(B_i, B_i, ..., B_i)$ is such that in response to K(i) input signals $x_k(i)$, k=1, 2, ..., K(i), the simul-gate $(B_i, B_i, ..., B_i)$ comprises M channels $C_m(i)$, m=1, 2, ..., M to propagate data signals to perform the Boolean function $B_i$ M times, where for each k=1, 2, ..., K(i), input signal $x_k(i)$ maps into an M-tuple of bits $(x_k(i, M), x_k(i, M-1), ..., x_k(i,2), x_k(i,1))$, where each $x_k(i, m)$ is a binary logic signal, where $x_k(i,m)$ is sent over channel $C_m(i)$ for each m=1, 2, ..., M, and where an output signal y(i) is a function of the M-tuple of binary signals $(B_i\{C_M(i)\}, B_i\{C_{M-1}(i)\}, B_i\{C_2(i)\}, B_i\{C_1(i)\})$, where for each k=1, 2, ..., K(i), $x_k(i,m)$ is sent over channel $C_m(i)$ for each m=1, 2, ..., M, where for each m=1, 2, ..., M, $\{C_m(i)\}$ is the set of binary logic signals $\{x_1(i,m), x_2(i,m), ..., x_K(i,m)\}$, and $B_i\{C_m(i)\}$ is the output of Boolean function $B_i$ for the set of binary logic signals $\{C_m(i)\}$.

The foregoing and other objects, aspects, features, and advantages of the invention will become more apparent from the following description and from the claims.

BRIEF DESCRIPTION OF THE DRAWINGS

The objects and features of the invention can be better understood with reference to the drawings described below, and the claims. The drawings are not necessarily to scale, emphasis instead generally being placed upon illustrating the principles of the invention. In the drawings, like numerals are used to indicate like parts throughout the various views.

FIGS. 7A through 7C are diagrams illustrating the behavior of a NAND-NAND logic gate such as shown in FIG. 5 in which the logic levels are spaced equidistantly in voltage.

FIG. 8A is a diagram of a decoder for logic level A=0.

FIG. 8B is a diagram of a decoder for logic level A<3.

FIG. 8C is a diagram of a decoder for logic level A=1.

FIG. 8D is a diagram of a decoder for logic level A=2.

FIG. 19 is a table that illustrates the values of the selector S and the corresponding logical operations that will be performed by each of a SIMU-ALU and a parallel arithmetic logic unit.

DETAILED DESCRIPTION

In the description that follows, the scope of the term "some embodiments" is not to be so limited as to mean more than one embodiment, but rather, the scope may include one embodiment, more than one embodiment, or perhaps all embodiments.

A methodology is presented for describing an input-output behavior of a multi-level logic gate to process simultaneously a multiplicity of independent Boolean logic functions, with each Boolean function processing signals carried on an individual, separate channel. An embodiment may simultaneously process the same data with the same function or with different functions, multiple data with the same function, or multiple data with different functions. In addition, multi-level logic signals (having more than two levels) may be processed, so that a higher communication bandwidth may be obtained without necessarily increasing the number of traces (wires).

Embodiments increase functional density at the logic gate level by combining multiple functions within a single gate. Embodiments may process simultaneously a multiplicity of independent Boolean logic functions, with each Boolean function processing signals carried on an individual, separate channel. An embodiment may simultaneously process the same data with the same function or with different functions, multiple data with the same function, or multiple data with different functions. In addition, multi-level logic signals (having more than two levels) may be processed, so that a higher communication bandwidth may be obtained without necessarily increasing the number of traces (wires). Such an embodiment may be referred to as a simul-gate.

Embodiments may be described by their input-output behavior. The input signals, and the output signal, may each in general have more than two logic levels, or values. For example, an input or output signal may have logic levels in the set $$\{0, \left(\frac{1}{3}\right)v, \left(\frac{2}{3}\right)v, v\},$$

where v is some voltage scale. A correspondence between the binary symbols 0 and 1 and these logic voltage levels may be taken as: $00 \leftrightarrow 0$;

$$01 \leftrightarrow \left(\frac{1}{3}\right)v; 10 \leftrightarrow \left(\frac{2}{3}\right)v;$$

and $11 \leftrightarrow v$. Other embodiments may have more than four logic levels. It is not necessary that the number of logic levels in a set of logic levels be a power of two.

Figure 1:
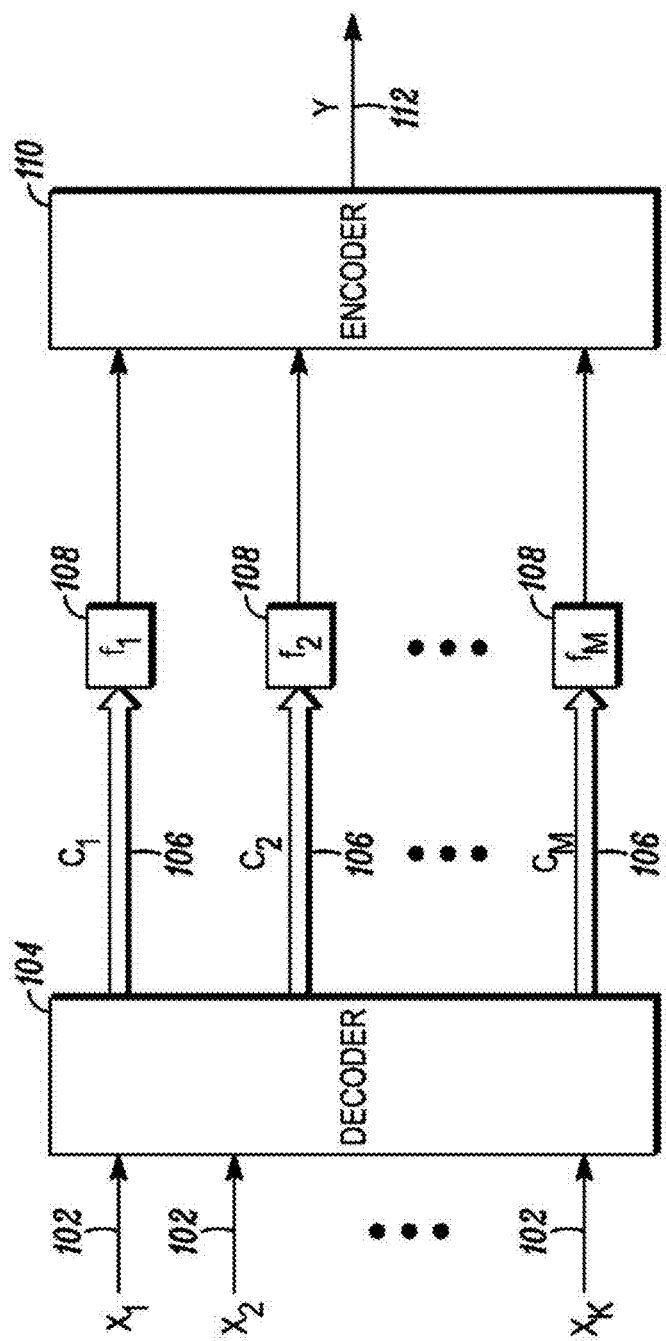
FIG. 1 illustrates the input-output relationship of a logic gate according to an embodiment.

Referring to FIG. 1, the input-output behavior of an embodiment may be represented by K input ports 102, decoder 104, M channels 106, M Boolean gates 108, encoder 110, and output port 112. There are K input signals, one for each input port, denoted by $x_k$, k=1, 2, ..., K. The output signal at output port 112 is represented by y. The M Boolean functions $f_m$, m=1, 2, ..., M denote the functional behavior of the Boolean gates, where each $f_m$ denotes the functional input-output behavior of its corresponding Boolean gate. The M channels may be represented by the symbols $C_m$, m=1, 2, ..., M. A channel $C_m$ may be considered a set of input ports for the Boolean gate corresponding to the Boolean function $f_m$.

In describing the input-output behavior of the embodiment in FIG. 1, each input signal $x_k$ is considered a multi-level logic signal, where decoder 104 decodes each multi-level logic signal into a set of binary signals. Each set of binary signals is dispersed among all the channels in the sense that for any particular set of binary signals, one binary signal from that set is provided to the first channel, a second binary signal from that set is provided to the second channel, and so on, so that the last binary signal from that set is provided to the last channel. For the particular embodiment illustrated in FIG. 1, each channel carries binary signals obtained from all the multi-level logic signals provided as input to decoder 104. However, other embodiments may have one or more channels that do not carry any binary signals associated with one or more input multi-level logic signals. Each channel may be viewed as carrying binary signals to its corresponding Boolean gate, where each Boolean gate then processes its binary signals to provide a binary output to encoder 110. Encoder 110 then encodes these binary signals to provide a multi-level logic signal at output port 112.

Embodiments may be described in more detail by introducing additional notation. Decoder 104 maps input signal $x_k$ into the M-tuple of bits $(x_k(M), x_k(M-1), \ldots, x_k(2), x_k(1))$ for each k=1, 2, ..., K, where each $x_k(m)$ is a binary logic signal, and where $x_k(m)$ is sent over channel $C_m$ for each m=1, 2, ..., M and for each k. In this way, for each m=1, 2, ..., M, channel $C_m$ carries the set of binary signals $\{x_1(m), x_2(m), \ldots, x_K(m)\}$. For each m=1, 2, ..., M, Boolean gate $f_m$ operates on the set of binary signals $\{x_1(m), x_2(m), \ldots, x_K(m)\}$ to provide an output binary signal that may be expressed as $f_m\{x_1(m), x_2(m), \ldots, x_K(m)\}$. This output binary signal may be written more compactly as $f_m\{C_m\}$, where when $C_m$ is the argument of $f_m$, it stands for the set of binary signals carried on channel $C_m$. Encoder 112 has as its input the M-tuple of binary signals $(f_M\{C_m\}, f_{M-1}\{C_{M-1}\}, \ldots, f_2\{C_2\}, f_1\{C_1\})$, and maps this into a multi-level logic output signal y.

For some embodiments, the output of each Boolean gate does not depend upon the ordering of its input signals. This was the motivation for using set notation in describing the input and output relationship of a Boolean gate. For example, the output binary signal of Boolean gate $f_m$ was written as $f_m\{C_m\}$. For some embodiments, the decoding scheme is separable in the sense that the same decoding scheme is applied separately to each $x_k$. If each Boolean gate does not depend upon the ordering of its input signals, and if the decoding scheme is separable so that the same decoding scheme is applied to each $x_k$, then because each channel $C_m$ carries the set of binary signals $\{x_1(m), x_2(m), \ldots, x_K(m)\}$ for each m=1, 2, ..., M, the output of the simul-gate is independent of the ordering of the input signals $x_k$.

For some embodiments the output of encoder 110 depends upon the ordering of its input signals. This was the motivation for using M-tuple notation for the encoder. As a result, for some embodiments the output signal y may depend upon the ordering of the correspondence between the Boolean gates and the channels. With this in mind, the input-output behavior for the embodiment of FIG. 1 may be referred to as an $(f_M, f_{M-1}, \ldots, f_2, f_1)$ simul-gate, where the use of an M-tuple reminds one that the input-output behavior may depend upon the ordering of the correspondence between the Boolean gates and the channels.

For some embodiments, the signals $x_k$ for k=1, 2, ..., K may be such that a decoder maps input signal $x_k$ into the M'-tuple of bits $(x_k(M'), x_k(M'-1), \ldots, x_k(2), x_k(1))$ for each k=1, 2, ..., K, where each $x_k(m)$ is a binary logic signal, but where M'≠M. For example, if M'>M, then not all of the binary signals may be carried by the channels. As another example, if M'<M, then some channels may carry the same set of binary signals, but to different logic gates. In general, a subset of the set of K M'-tuples $\{(x_k(M'), x_k(M'-1), \ldots, x_k(2), x_k(1)), k=1, 2, \ldots, K\}$ is transmitted over the M channels. A subset may not be a proper subset. That is, a subset of a set may be the set itself.

Figure 2:
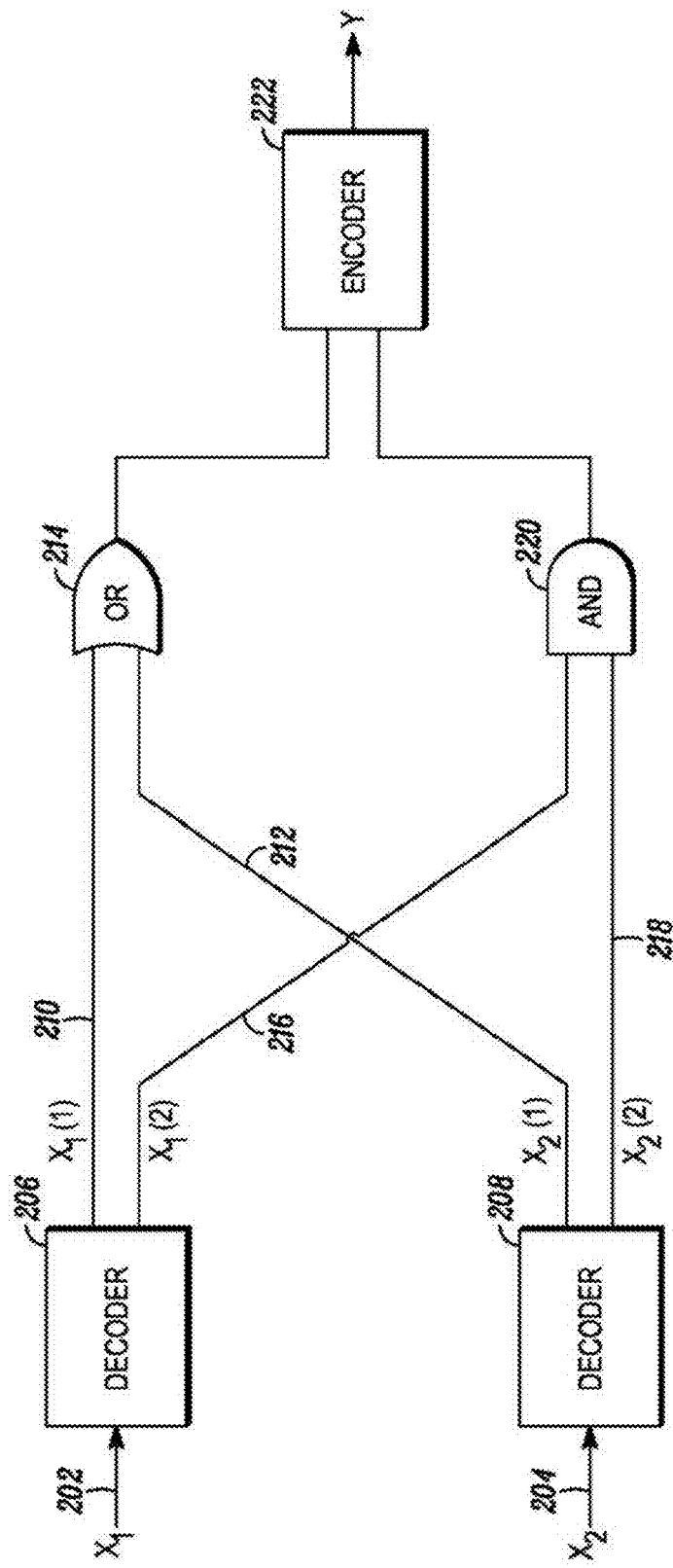
FIG. 2 illustrates the input-output relationship of an (AND, OR) logic gate according to an embodiment.

To provide a specific example of a simul-gate, an (AND, OR) simul-gate embodiment is illustrated in FIG. 2. The (AND, OR) simul-gate has two input ports: port 202 for input signal $x_1$ and port 204 for input signal $x_2$. Input signals $x_1$ and $x_2$ are each four-level logic signals, described by the set of voltage levels $$\left\{0, \left(\frac{1}{3}\right)v, \left(\frac{2}{3}\right)v, v\right\},$$

or for simplicity, $$\left\{0, \left(\frac{1}{3}\right), \left(\frac{2}{3}\right), 1\right\},$$

where v is taken as unity. The decoding scheme is separable, where decoder 206 decodes input signal $x_1$, decoder 208 decodes input signal $x_2$, and decoders 206 and 208 each perform the identical decoding function:

$$0 \to 00; \left(\frac{1}{3}\right) \to 01; \left(\frac{2}{3}\right) \to 10;$$

and $1 \to 11$.

Associated with channel $C_1$, denoted by data flows 210 and 212, is the Boolean OR function, represented by OR gate 214. Associated with channel $C_2$, denoted by data flows 216 and 218, is the Boolean AND function, represented by AND gate 220. Encoder 222 performs the inverse of decoders 206 and 208. That is, $00 \to 0$;

$$01 \to \left(\frac{1}{3}\right); 10 \to \left(\frac{2}{3}\right);$$

and $11 \to 1$, where the lowest and highest order bits in 00, 01, 10, and 11 refer to, respectively, the outputs of OR gate 214 and AND gate 220.

With the decoding and encoding schemes so defined, it is straightforward to develop the truth table for the (AND, OR) simul-gate of FIG. 2. For example, for $x_1=2/3$ and $x_2=1/3$, the output is $y=1/3$. Note that for an (OR, AND) simul-gate, OR gate 214 and AND gate 220 would exchange places in the topology of FIG. 2, so that an AND gate would be associated with channel $C_1$, and an OR gate would be associated with $C_2$. The truth table for the (OR, AND) gate is different from the truth table for the (AND, OR) gate.

Figure 3:
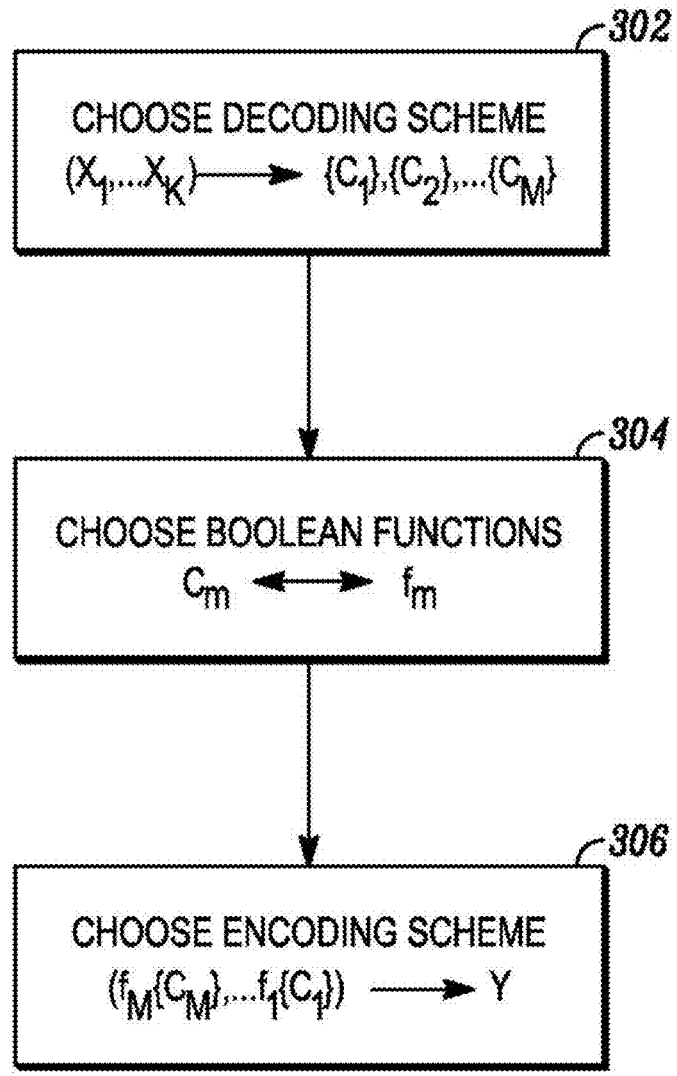
FIG. 3 illustrates a methodology for constructing the input-output relationship of a logic gate according to an embodiment.

The data flows and logic gates in FIG. 1 illustrate the input-output behavior of a simul-gate, but do not necessarily represent a hardware description of an embodiment. FIG. 1 and its description provide a methodology for describing simul-gates and constructing their input-output relationships based upon well known Boolean functions. FIG. 3 summarizes this method, where in block 302 a decoding scheme is chosen to decode K input multi-level logic signals into a set of M bits on each channel of M channels; in block 304 Boolean functions are chosen for each channel; and in block 306 an encoding scheme is chosen for encoding the output of the Boolean functions into the output signal.

Figure 4:
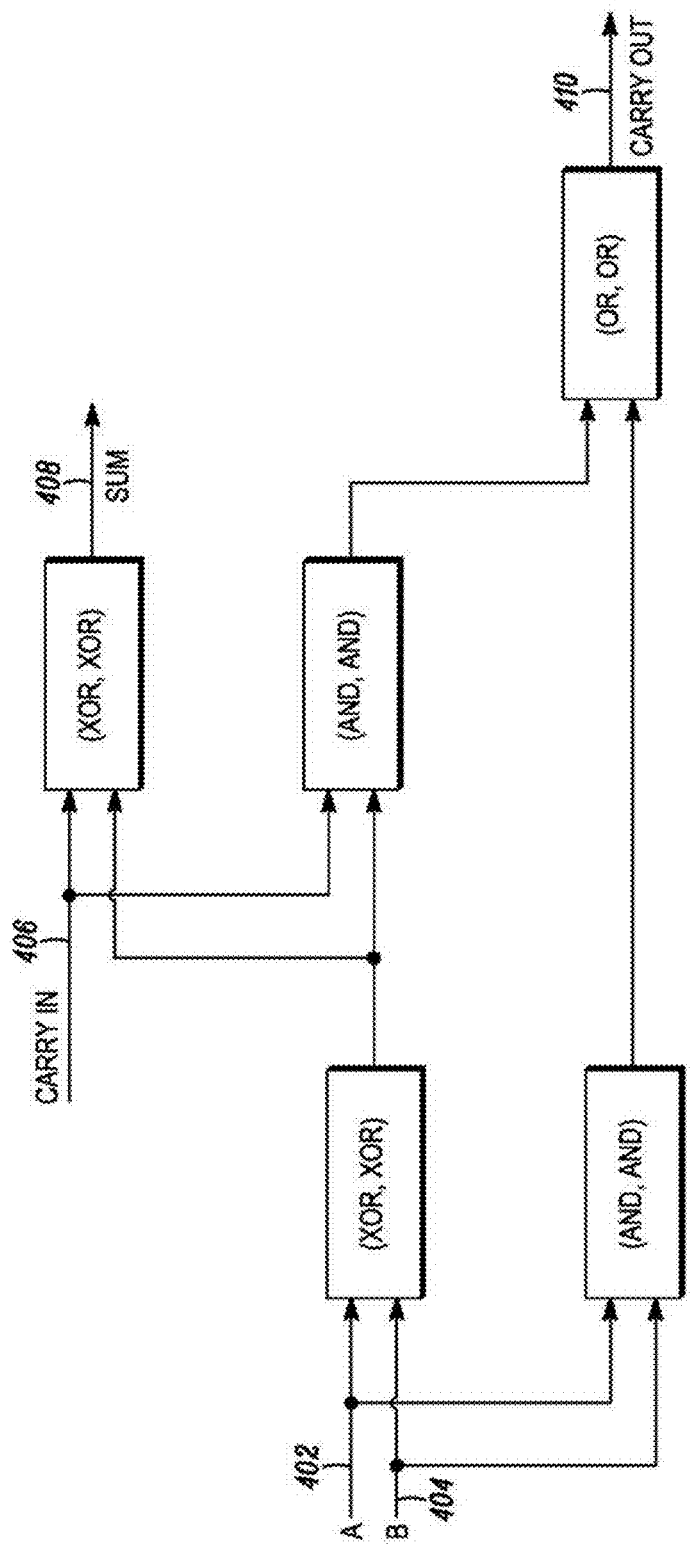
FIG. 4 illustrates the input-output relationship of an adder logic unit according to an embodiment.

The methodology described herein may also be used to provide embodiments to increase the number of bits that are processed in a conventional system of conventional logic gates by replacing the conventional gates with simul-gates that perform the same function but on multiple channels. A particular example is illustrated in FIG. 4, where the methodology described herein was applied to a conventional one bit full adder logic unit. In this example, where the conventional full bit adder logic unit has a logic OR, AND, or XOR (exclusive OR) gate, that gate is replaced with, respectively, an (OR, OR), (AND, AND), or (XOR, XOR) simul-gate.

In FIG. 4, input signals "A" and "B" at input ports 402 and 404, and input signal "CARRY IN" at input port 406, are multi-level logic signals; and output signal "SUM" at output port 408 and output signal "CARRY OUT" at output port 410 are also multi-level logic signals. These signal names are derived from the conventional signal names in a conventional adder, where "A" and "B" represent the bits to be added along with the "CARRY IN" bits, and "SUM" represents the resulting sums where "CARRY OUT" are the bits to be carried over into the next adder unit. The encoding and decoding scheme as described with respect to the embodiment of FIG. 2 may be used with the simul-gates in the embodiment of FIG. 4. In this way, the embodiment of FIG. 4 processes two bits at a time.

For some embodiments, because the CARRY OUT signal isn't available for higher order bits until the lower order bits have been added, parts of the numbers to be added by an adder with simul-gates are time shifted so that the CARRY OUT signal is available when needed. The following example makes this clear. Suppose the numbers U and V are to be added, the numbers W and X are to be added, and the numbers Y and Z are to be added. Let the first and second bits of U be denoted as U[1] and U[2], respectively. Similar notation applies to the other numbers. Then for the first addition cycle, only one half of the adder is adding the two one-bit numbers U[1] and V[1]. At the second addition cycle, W[1] and X[1] are being added while at the same time U[2] and V[2] are being added. Because the part of the CARRY OUT signal associated with U[1] and V[1] is available at the beginning of the second addition cycle, it may be used in the CARRY IN signal for adding U[2] and V[2]. At the third addition cycle, Y[1] and Z[1] are being added, and W[2] and X[2] are being added. Because the part of the CARRY OUT signal associated with W[1] and X[1] is available at the beginning of the third addition cycle, it may be used in the CARRY IN signal for adding W[2] and X[2]. At the fourth addition cycle, only one half of the adder is adding the two one-bit numbers Y[2] and Z[2], and the part of the CARRY OUT signal associated with Y[1] and Z[1] is available to be used in the CARRY IN signal for adding Y[2] and Z[2].

In general, once a logic circuit has been specified comprising a set of N Boolean logic gates $\{B_i, i=1, 2, \ldots, N\}$, along with their interconnections, then a logic circuit comprising simul-gates may synthesized in which each logic gate $B_i$ is replaced with the simul-gate $(B_i, B_i, \ldots, B_i)$, where $B_i$ is repeated M times.

The embodiments described here are applicable to sequential logic as well as to combinational logic. Various modifications may be made to the disclosed embodiments without departing from the scope of the invention as claimed below.

Logic Gates

In the flowing description, the term "logic gate" will be used to refer to simu-gates in which N monotonic levels of signal are processes, where N is greater than 2. Conventionally, the term "logic gate" is ordinarily applied to systems in which there are only two logic levels. Since the invention of digital computers in the 1940's, there have been systems using conventional binary digital signals with two states (e.g., TRUE or FALSE, "1" or "0", "on" or "off", HIGH or LOW). Here, the simu-gates can be considered either to process simultaneously M binary signals that have been combined into signals with $2^M$ logic levels, or they can be considered to process signals with N discrete monotonic logic levels, where N is greater than 2.

We now describe a number of exemplary logic gates that can operate according to principles of the invention. While the examples employ logic having four states, it should be understood that analogous logic having N logic states, where N is at least three distinct logic states, are contemplated. In particular, N does not have to be an integer that is a power of 2, but N can be a power of 2 in some embodiments. N does not need to be an even number. The logic gates can be characterized by respective truth tables. As is understood in the computer logic arts, a truth table relates one or more input variables of a logic gate to one or more output variables of the logic gate. For the embodiments that will be illustrated, a plurality of input variables each of which can take a number N of input states can be provided to a logic gate, and at least one output is provided by the logic gate, which output can have a value selected from at least some of the N logic states, as described by a corresponding truth table. While the present disclosure will not discuss the relationship between using positive logic and negative logic, those relationships are well known (for example as DeMorgan's laws) in the logical arts. Any logic gate described in one of positive or negative logic can also be understood to operate in the other logic, after application of DeMorgan's laws.

In describing logic gates, there will be shown circuit diagrams that include a number of transistors, some of which can be configured as diodes to provide predetermined voltage shifts (e.g., by having the base connected to the collector in a p-n-p transistor or the gate terminal connected to the drain in an FET). While these circuits can be fabricated using the transistors as shown in standard MOS technology, it is expected that one can design a chip in which the entire logic gate is fabricated as a single device having only the required number of input terminals, output terminals and reference voltage terminals.

As will become apparent from the following description and the drawings, in some embodiments, the N logic states can correspond to a sequence of N monotonically increasing voltage levels (or electronic signal levels), which can be, but do not have to be, N equally spaced voltage levels.

NAND-NAND Gate

Figures 5, 6:
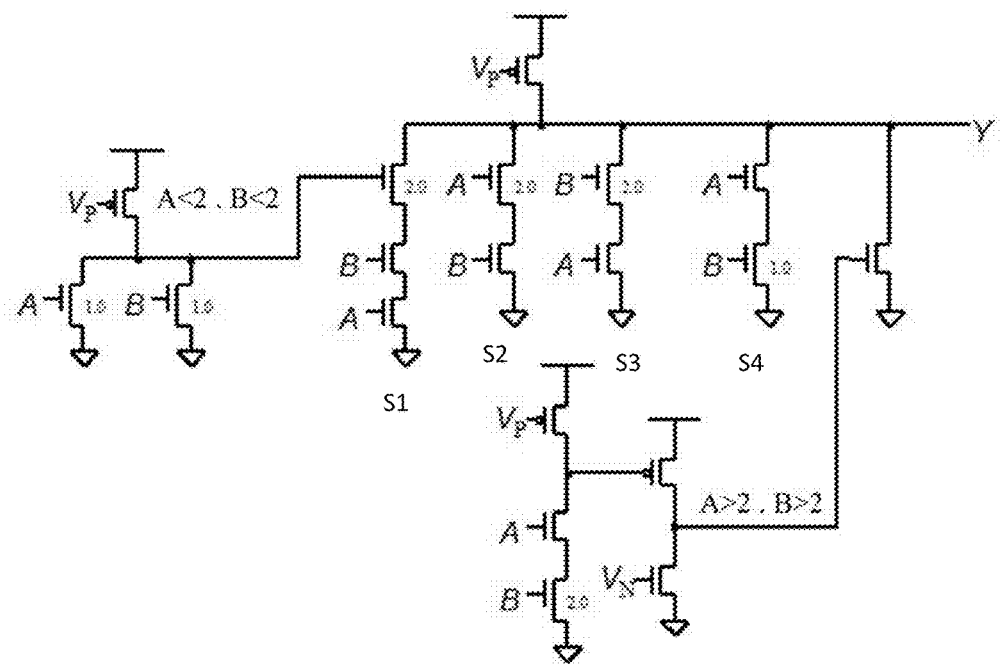
FIG. 5 is a circuit diagram of a NAND-NAND logic gate operating on signals having N=4 logic states.
FIG. 6 is the truth table that corresponds to the logic gate of FIG. 5.

FIG. 5 is a circuit diagram of a NAND-NAND logic gate operating on signals having N=4 logic states. For simplicity of exposition, the four states can be labeled 0, 1, 2, and 3, which can be interpreted as a lowest state, two intermediate states, and a highest state. Advantages of apparatus and methods that employ N greater than 2 logic states can include more efficient wiring, especially as the number of transistors and gates increases, and improvements in computation, because each computational cycle can process a larger amount of data as N increases. FIG. 6 is the truth table that corresponds to the logic gate of FIG. 5. A conventional NAND gate is understood to provide the negative of an AND gate. A conventional AND gate obeys the logic that unless all of the inputs are TRUE (for example logic 1 binary), the output is FALSE (corresponding logic 0 binary).

We now explain the rules that govern the operation of the NAND/NAND gate of FIG. 5. FIG. 6 shows the result that if any input is logic 0 (e.g., the lowest state) the output is logic 3 (e.g., the highest state). If all inputs are in the highest state (state 3), the output is in the lowest state (state 0). For mixed inputs, the output can be defined as shown, with symmetry about the diagonal axis from the upper left corner to the lower right corner of the truth table. A NAND truth table having three inputs for a logic gate using N=4 states will be discussed hereinafter, which gate is analogous to a conventional binary three input NAND gate. It is therefore contemplated that apparatus and methods for logic gates having N greater than 2 states and more than two input terminals each of which can accommodate an input variable having N greater than 2 logic states can be constructed according to the principles described herein.

Vp is the bias level for the PMOS transistors. Its value is a threshold voltage below the positive supply. For the sake of discussion, we will take this supply to provide $V_{DD}$ volts.

One implementation of the NAND/NAND function is shown in FIG. 5. In addition to standard MOS FETs it also used two special transistors. These transistors effectively have either 1V or 2V voltages in series with the transistors source terminal. This can be implemented with a zener diode fabricated on the source contacts, or alternatively by connecting one or two FETs connected as diodes in the circuit to perform the needed voltage offsets.

These are used in combination to sense multiple input logic levels and provide voltage distinct output logic levels.

As may be seen in the above circuit the Y node is a wired "OR" with a PFET pull up. In multilevel terms this is a "wired minimum" since the node with pull down to the lowest part of the decode tree.

From the truth table it can be seen that there are many "3" levels on the output, i.e., no decode branches are active and the Y node pulls up to $V_{DD}$ (level 3). Note that there is just one "0" code on the output when A=3 and B=3. On the bottom right part of the circuit the decode circuit can be seen. The B transistor has a 2 in its source, and so does not turn on unless B>2. The A transistor is in series and so has the same property.

When both A and B equal 3 the Y node is pulled to zero through the inverter and pull down transistor. The other codes are designed in a similar way.

The input signals to the circuit in FIG. 5 are A and B. These signals can have a voltage value chosen from one of multiple values, which in this embodiment are illustrated by N=4 states 0, 1, 2, and 3 respectively. In this embodiment, the natural $V_{th}$ for the NMOS transistors is about 0.5V. State 1 refers to a value of voltage (here approximately 1 V) at input A or B that is greater than one $V_{th}$ but less than state 2. State 2 is set by the layout of special transistors with a programming gate. For this discussion, these transistors are expected to be programmed to have a threshold voltage of 1V. State 2 refers to an input value greater than 1V but less than 2V. State 3 is defined by programming the special transitions to have a threshold of 2V. This state refers to any signal value having a 2V or greater value. $V_N$ is also a bias point of the n-channel transistors.

Figure 9:
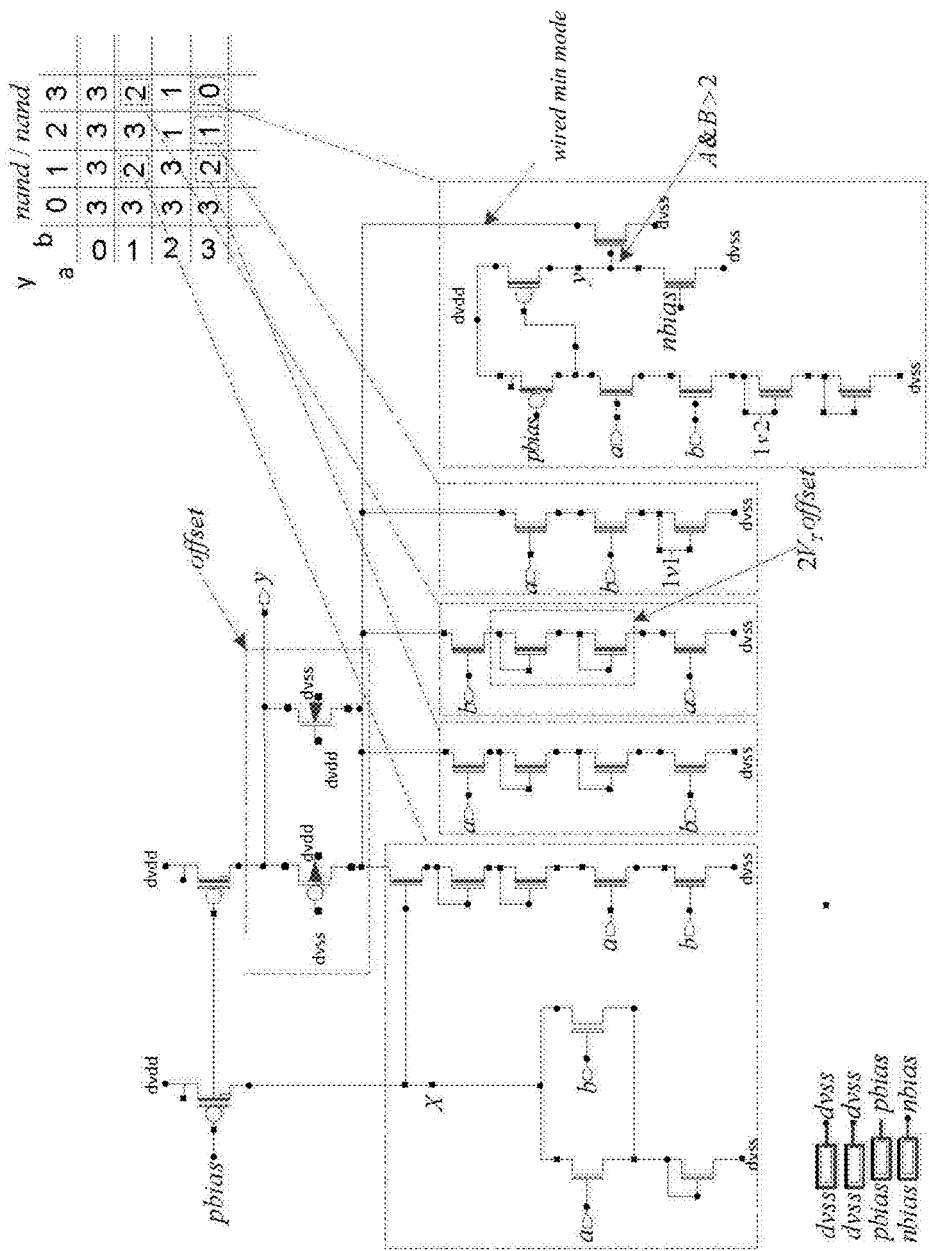
FIG. 9 is a circuit diagram of an alternative embodiment of a NAND/NAND gate.

In FIG. 5 there are transistors labeled 1.0 and 2.0 which are specially drawn with their gate only at one half of their length. These transistors are specially designed with a gap between the source and the gate of the transistor. The turn on threshold voltage of these transistors is a function of this gap. This threshold voltage can be designed (and can be varied) during the layout process by geometrically adjusting the length of the gap. The transistor labeled 1.0 has a 1.0V threshold voltage and the transistor labeled 2.0 has a 2.0V threshold voltage. These transistors allow us to compare values of the input signal with a known reference voltage defined by the designed threshold of the device. The transistors also act like a voltage clamp. Their minimum $V_{DS}$ clamps at the designed voltage and will not drop any further. An equivalent circuit to that shown in FIG. 5 can also be constructed using conventional transistors, as illustrated in FIG. 9.

We now describe the operation of the circuit from left to right.

The first branch (referred to as Input 1) is similar to a NOR gate. This branch responds to any value for A or B that is higher than the 2 state. In this branch we are using the transistors programmed to have a 1.0V threshold. The output of this branch is either a 3 or 1 because the output clamping nature of the programmable transistor. For any 2 or higher at either A or B input it produces an output 1. If A and B are both less than 2, both the A and B transistors are "off" and the output of this circuit is 3.

The output of Input 1 is fed into the next portion of the circuit. This portion of the circuit comprises three branches labeled S1, S2 and S3, respectively. These three branches are three input NAND gates that are connected by being logically "NOR"ed together. Each branch is a three input NAND.

The first branch, S1, is in an off state (producing a 3). It will produce a logic 2 only if both A and B are greater than logic 1 and the output of the prior stage is a logic 3 (meaning one of them is less than logic 2).

The second branch S2 produces an output of logic 3 (2V) if B has a value greater than 1 (1=0.5V or Vth) and A is at state 3 (e.g., a value greater than 2V).

The third branch S3 produces an output of logic 3 (2V) if A is at logic level 2 (1V) and B has a value greater than logic 3 or 2V.

The 4$^{th}$ branch S4 produces an output of 2 (1V) if A is a value greater than 1 and B has a value greater than 2 (1V).

The circuit referred to as the "input 2" produces a zero output if B is in logic state 3, and A is at a logic level higher than state 1.

This is to be compared to the truth table given in FIG. 6. For A=0, B=0 the first branch produces a 3, because S1, S2, S3 and S4 are all off and the branch called "input 2" drives the output to 3. For A=1, B=0, Input 1 branch produces a 3, because S1, S2, S3 and S4 are off and "input 2" branch drives the output to 3. For A=0 and B=1, the same thing happens, and the output is 3, e.g., the gate is symmetric with regard to inputs A and B. For A=1, B=1, the S1 branch drives the circuit to an output value of 2. For A=3 and B=1 (or A=1 and B=3) the output is again 2. For A=2 and B=2 (or for A=2, B=3, or A=3, B=2), the output is 1. For A=3 and B=3, the output is 0.

The two input NAND/NAND has two inputs and one output but performs the function of two conventional NAND gate in parallel. This is achieved by mapping the input and output pins into four states, rather than binary. The following table illustrates this for the A input of the two NAND gates.

| Value of A | Nand1 A Input Value | Nand2 A Input Value |
|---|---|---|
| 0 | 0 | 0 |
| 1 | 1 | 0 |
| 2 | 0 | 1 |
| 3 | 1 | 1 |

This is repeated for all terminals of the function. When this is done it is possible to map the two NAND gates into a four level function given by the truth table in FIG. 6. Function mapped this way have the property that they can be connected in circuits in the same way that standard binary elements can be connected with the exception that two (or more) parallel circuits are produced. The goal of this technique is to be able to enable multiple circuits to operate in parallel with reduced wiring overhead. Note that simultaneous functions coded thus can be connected together using conventional logic design methods.

FIGS. 7A through 7C are diagrams illustrating the behavior of a NAND-NAND logic gate such as shown in FIG. 5 in which the logic levels are spaced equidistantly in voltage. FIG. 7A shows the variation of the signal applied to the A input with time, which input increases monotonically at times measured in 10, 20, and 30 units. FIG. 7B shows the variation of the signal applied to the B input with time, which input increases monotonically at times measured in 2.5, 5, and 7.5 units, and repeats each 10 units of time, so that all 16 combinations of A and B input values are provided. FIG. 7C shows the signal appearing at output Y for each of the 16 combinations of A and B inputs. As is seen in FIG. 7C, the output signal at Y corresponds to the values in the truth table shown in FIG. 6.

Decoder Primitives

FIG. 8A through FIG. 8D illustrate embodiments of decoders that can accept an input signal having a logic state value of 0, 1, 2, or 3 and return a decoded value. Each decoder gate decodes an input level. The decoder gates can provide a result by indicating that an expected level is "present" or "absent" (e.g., turning on or off a line which is interpreted as a logic level, or in many cases, the output can be provided as a binary result. In these examples, 4 logic level thresholds are related to the supply voltage as $V_T$, 2 $V_T$, ~3$V_T$ to $V_{DD}$-$V_{Tp}$. Decoders that decode a number of logic states other than N=4 are also contemplated.

Figure 8E:
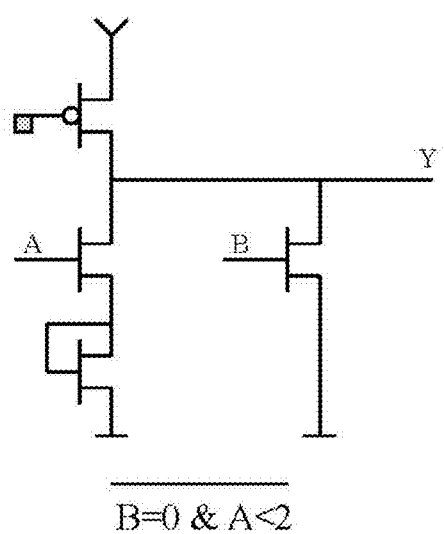
FIG. 8E is a schematic diagram of a circuit element that behaves as a wired minimum.

FIG. 8A is a diagram of a decoder for logic level A=0.
FIG. 8B is a diagram of a decoder for logic level A<3.
FIG. 8C is a diagram of a decoder for logic level A=1.
FIG. 8D is a diagram of a decoder for logic level A=2.
FIG. 8E is a schematic diagram of a circuit element that behaves as a wired minimum. Most of the gates illustrated make use of a "wired minimum" structure for circuit minimization. In FIG. 8E the A term in this function pulls down to ~$V_T$. The B term pulls down to ~$V_{SS}$. i.e., the wired connection pulls down to the lowest common sub-term output.

FIG. 9 is a circuit diagram of an alternative embodiment of a NAND/NAND gate that operates using four logic levels and the decoder primitives as shown in FIG. 8A through FIG. 8D.

Figure 10:
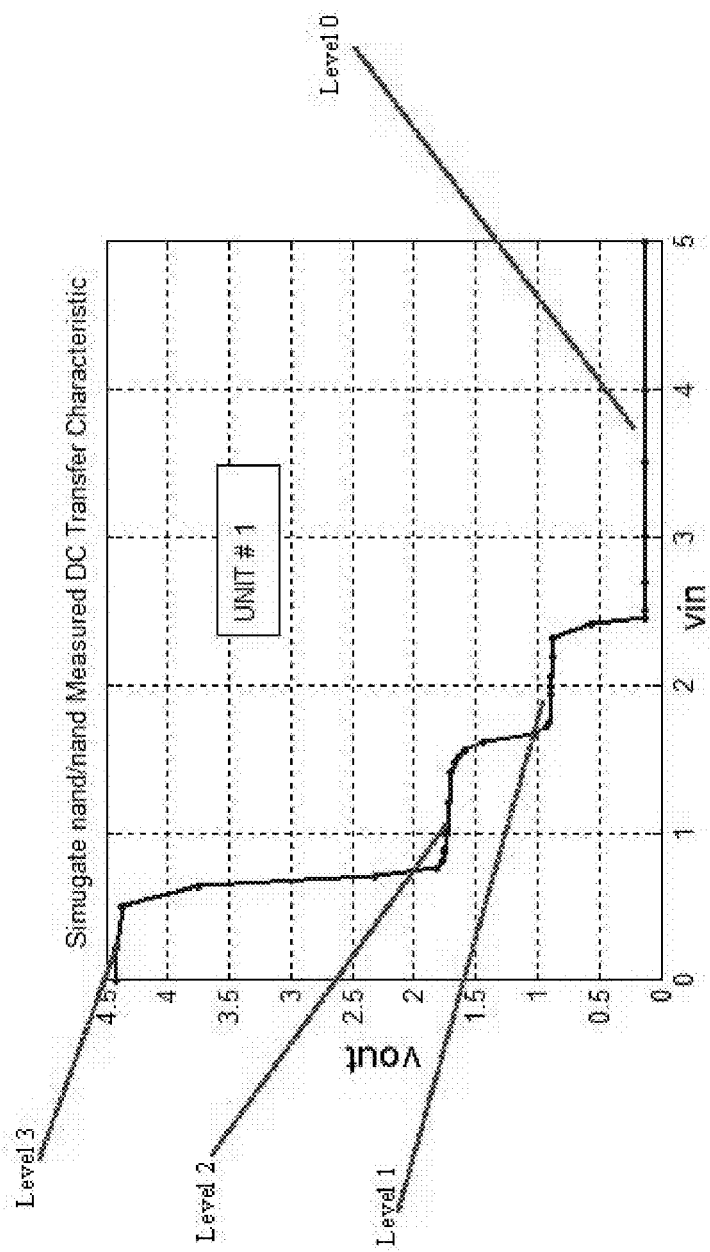
FIG. 10 is a graph that illustrates the voltage transfer characteristics for a NAND/NAND gate.

FIG. 10 is a graph that illustrates the voltage transfer characteristics for a NAND/NAND gate.

Figure 11:
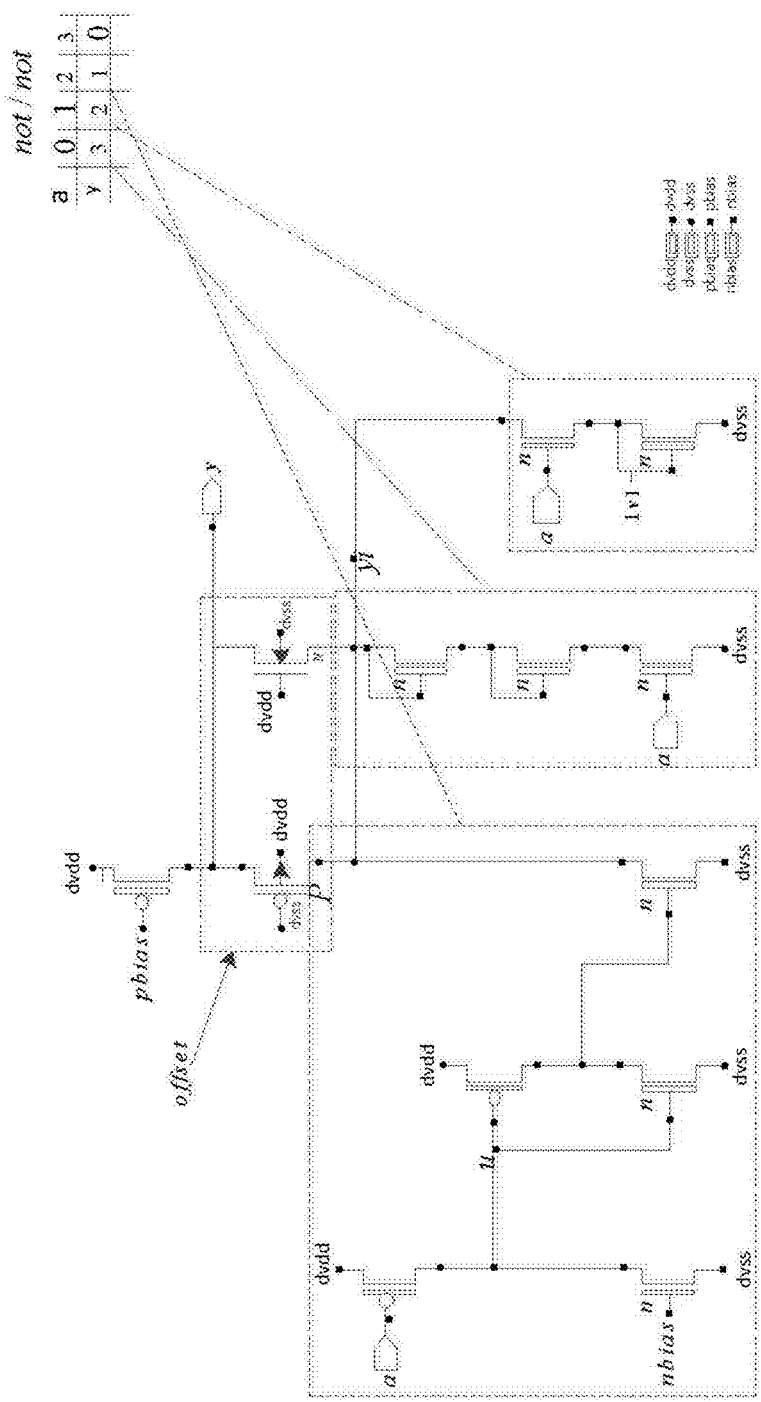
FIG. 11 is a circuit diagram of an embodiment of a NOT/NOT gate.

FIG. 11 is a circuit diagram of an embodiment of a NOT/NOT gate that operates using four logic levels and the decoder primitives as shown in FIG. 8A through FIG. 8D. The truth table for the NOT/NOT gate is illustrated in the upper right corner of FIG. 11.

Figure 12A:
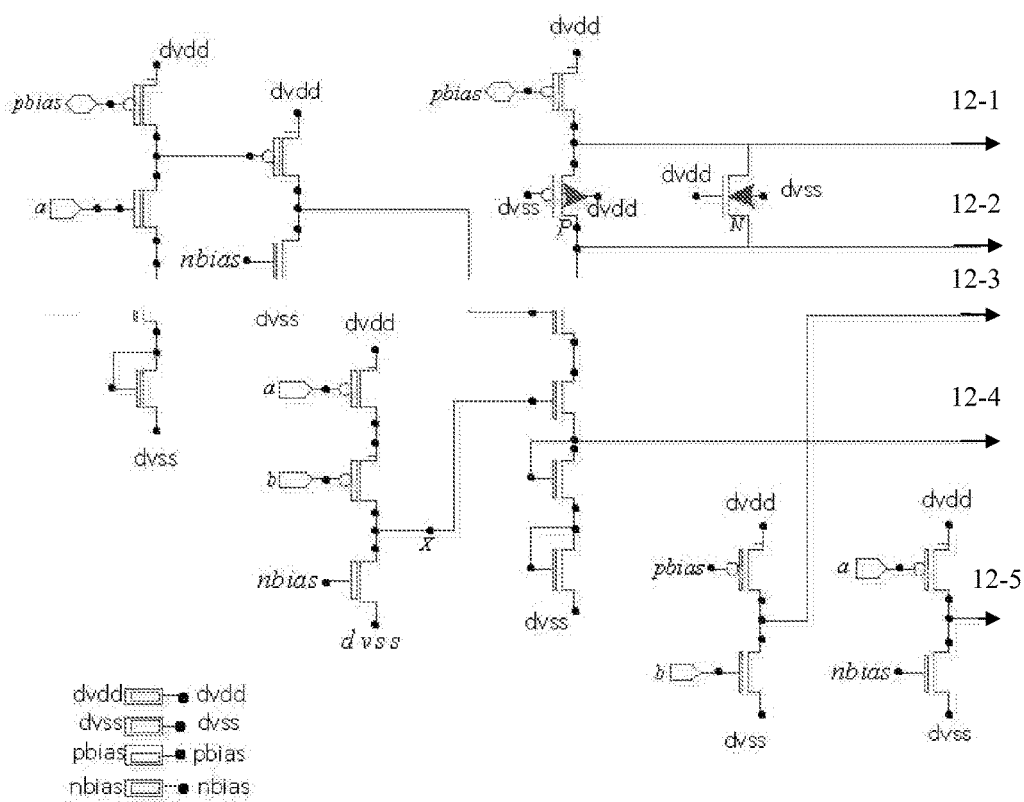
FIGS. 12A and 12B are a circuit diagram of an embodiment of a OR/OR gate.
Figure 12B:
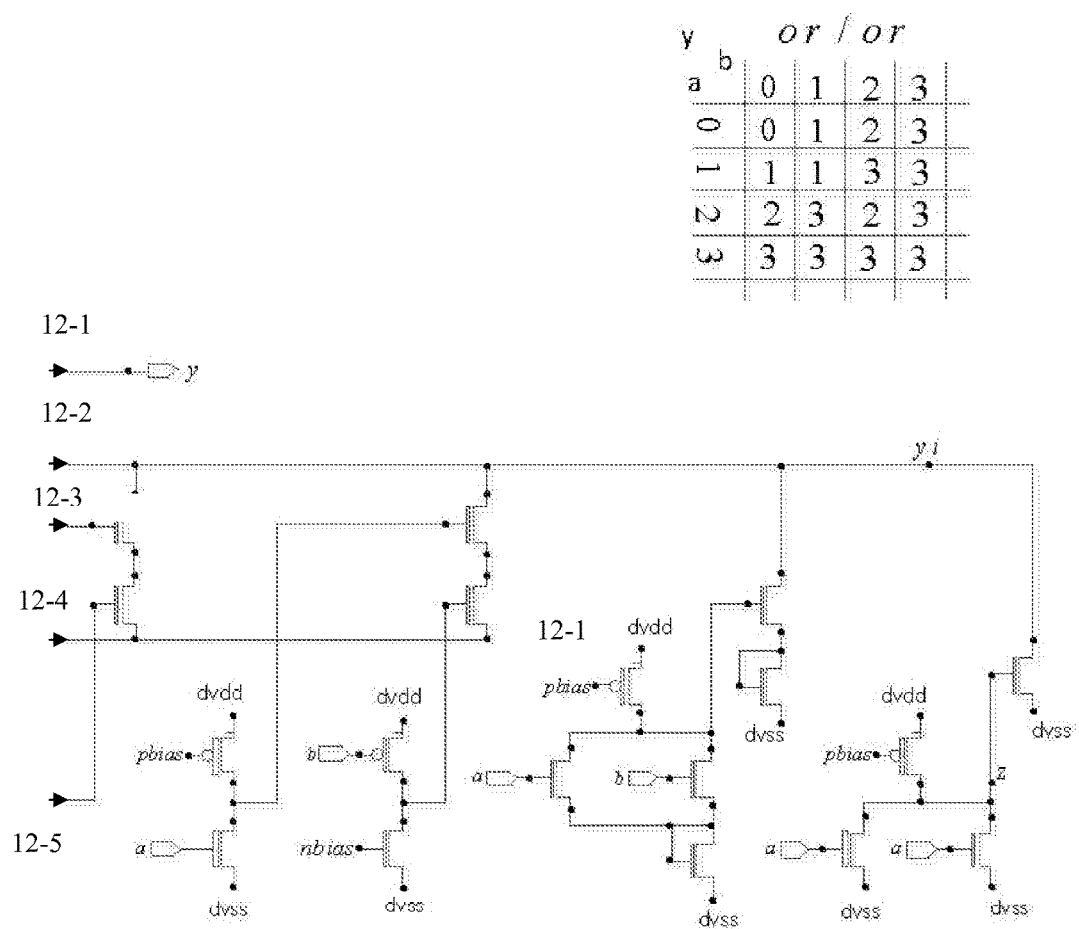

FIGS. 12A and 12B are a circuit diagram of an embodiment of a OR/OR gate that operates using four logic levels and the decoder primitives as shown in FIG. 8A through FIG. 8D. The truth table for the OR/OR gate is illustrated in the upper right corner of FIG. 12B.

Figure 13A:
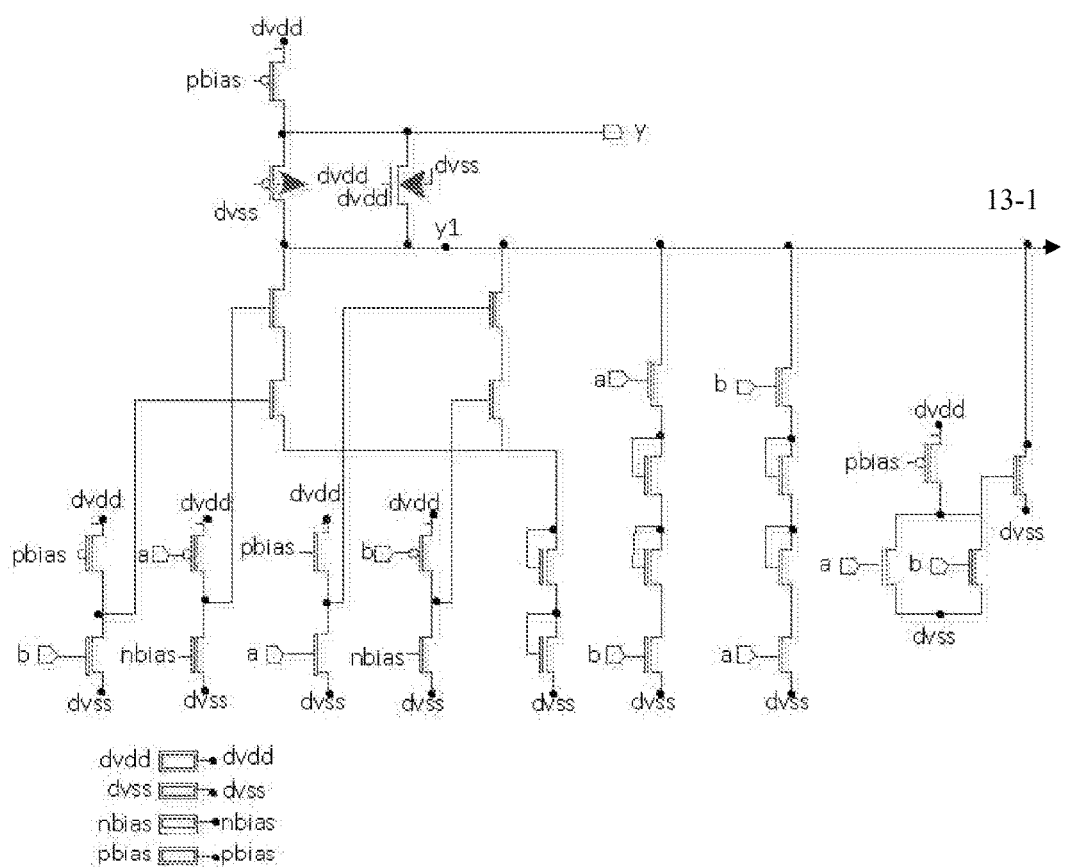
FIGS. 13A and 13B are a circuit diagram of an embodiment of a XOR/XOR gate.
Figure 13B:
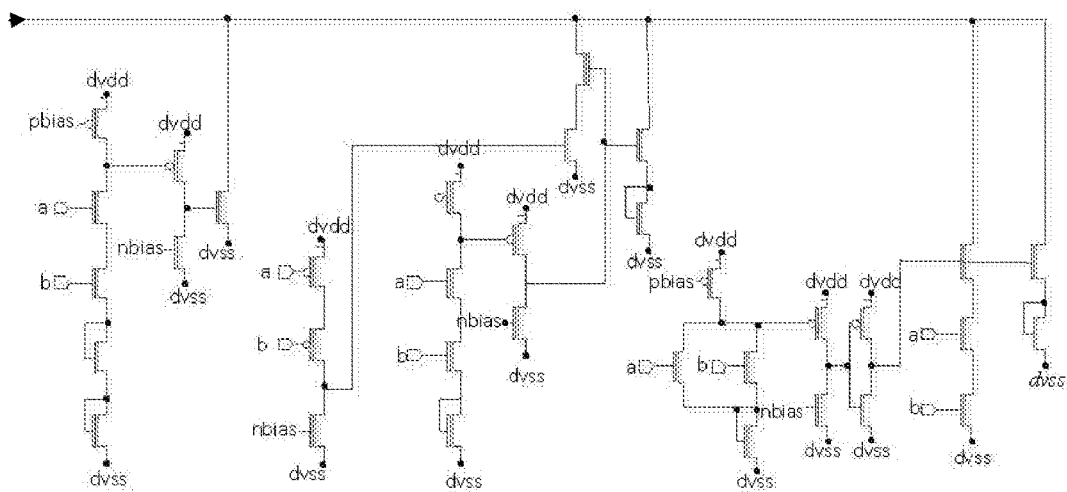

FIGS. 13A and 13B are a circuit diagram of an embodiment of a XOR/XOR gate that operates using four logic levels and the decoder primitives as shown in FIG. 8A through FIG. 8D. The truth table for the XOR/XOR gate is illustrated in the upper right corner of FIG. 13B.

Figure 14A:
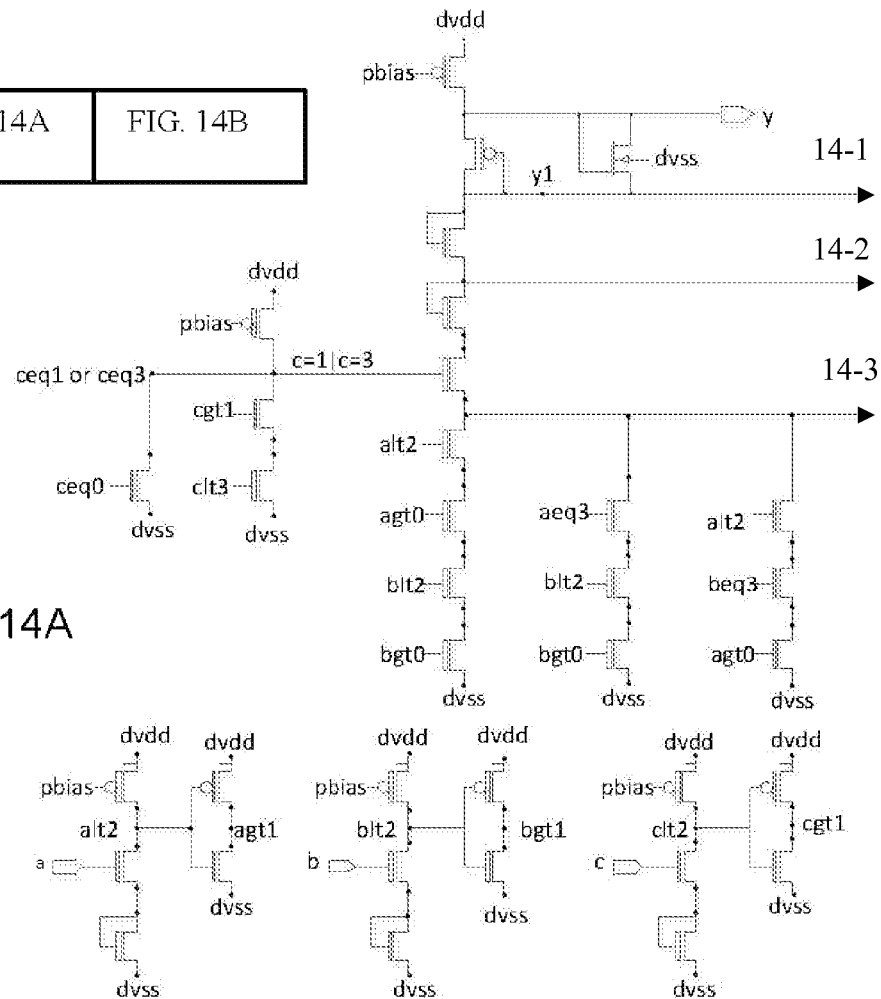
FIGS. 14A and B are a circuit diagram of an embodiment of a NAND3/NAND3 gate.
Figure 14B:
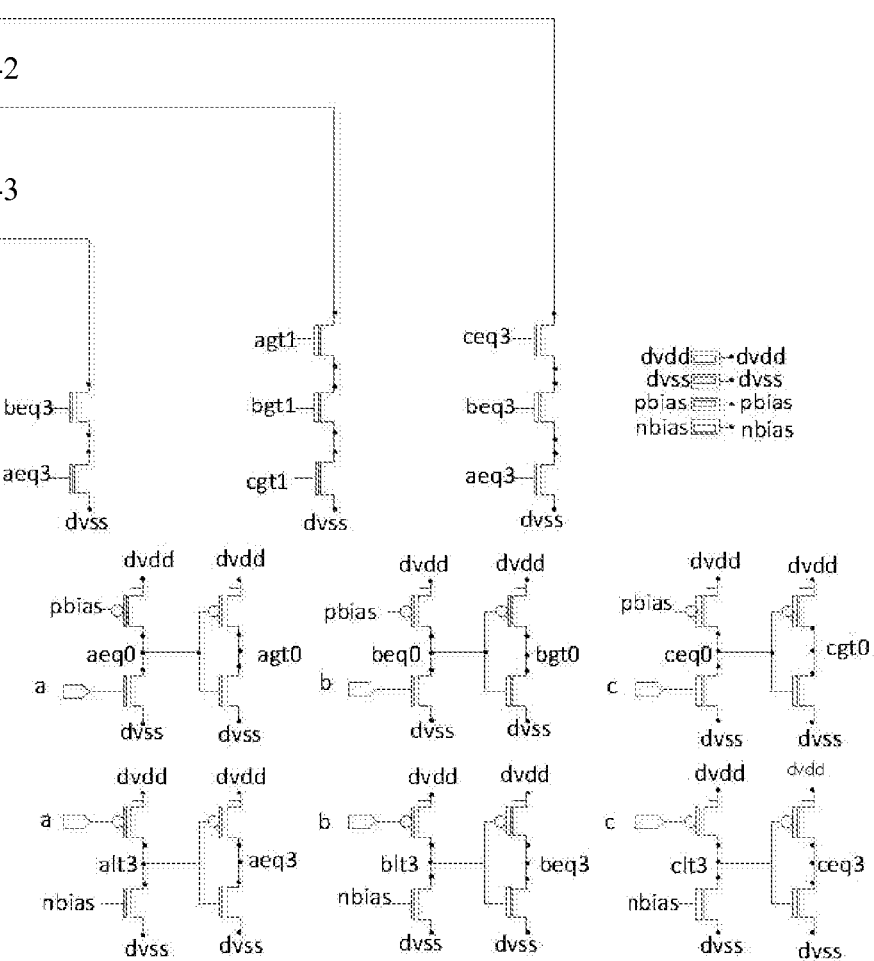

FIGS. 14A and 14B are a circuit diagram of an embodiment of a NAND3/NAND3 gate that operates using four logic levels and the decoder primitives as shown in FIG. 8A through FIG. 8D. The truth table for the NAND3/NAND3 gate is illustrated in the bottom of FIG. 14A. The NAND3/NAND3 gate is a three input NAND gate for inputs having 4 logic state levels each. In FIGS. 14A and 14B, the three inputs are identified as A, B, and C. The truth table shows the values of C=logic state 0 in the upper left quadrant of the truth table, values of C=logic state 1 in the upper right quadrant of the truth table, values of C=logic state 2 in the lower left quadrant of the truth table, and values of C=logic state 2 in the lower right quadrant of the truth table. The truth table could also be represented in three dimensions with the A input logic state values given as the vertical axis of a face of a cube, the B input logic state values given as the horizontal axis of a face of a cube, and the C input given along a horizontal axis of a cube normal to the face represented by the A and B input logic state values. The output values would then be shown at the intersection of three axial distances within the cube.

Other logic circuits can be designed to operate according to any of an AND/AND truth table (for example, the logical negative of a NAND/NAND truth table), a NOR/NOR truth table (for example, the logical negative of an OR/OR truth table), or other truth tables.

Simultaneous Arithmetic Logic Unit

Figure 15:
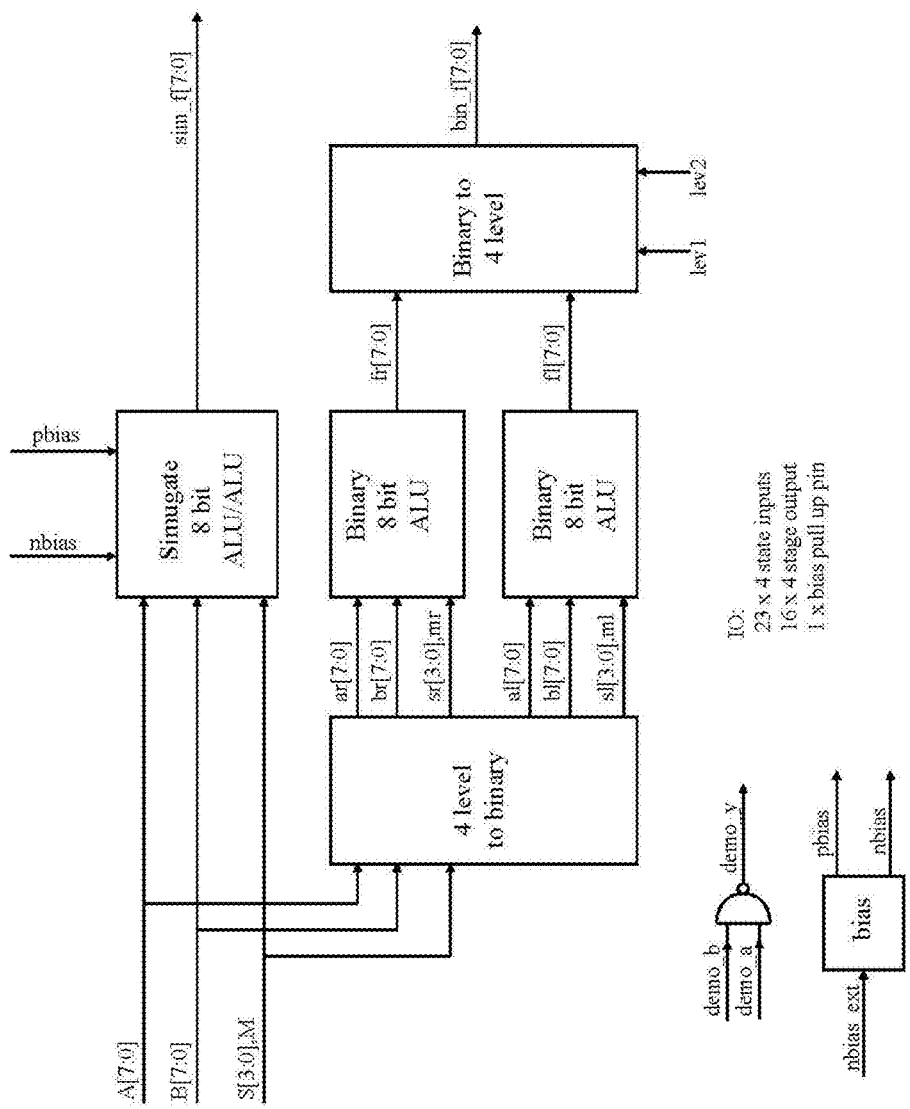
FIG. 15 is a schematic diagram of an embodiment of a simultaneous arithmetic logic unit ("SIMU-ALU") that operates using four logic levels.
Figure 16:
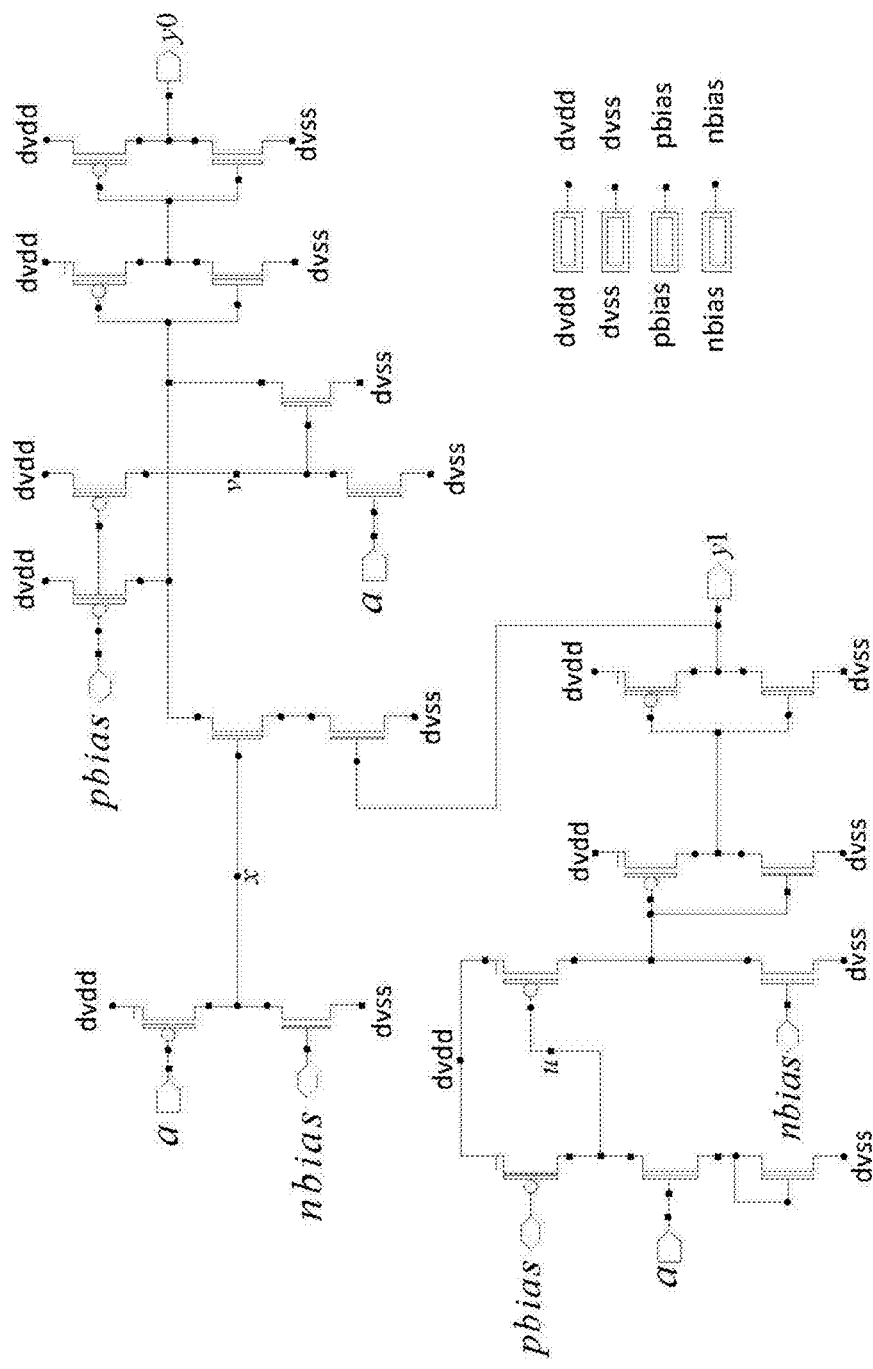
FIG. 16 is a circuit diagram of a 4-level to binary decoder.
Figure 17:
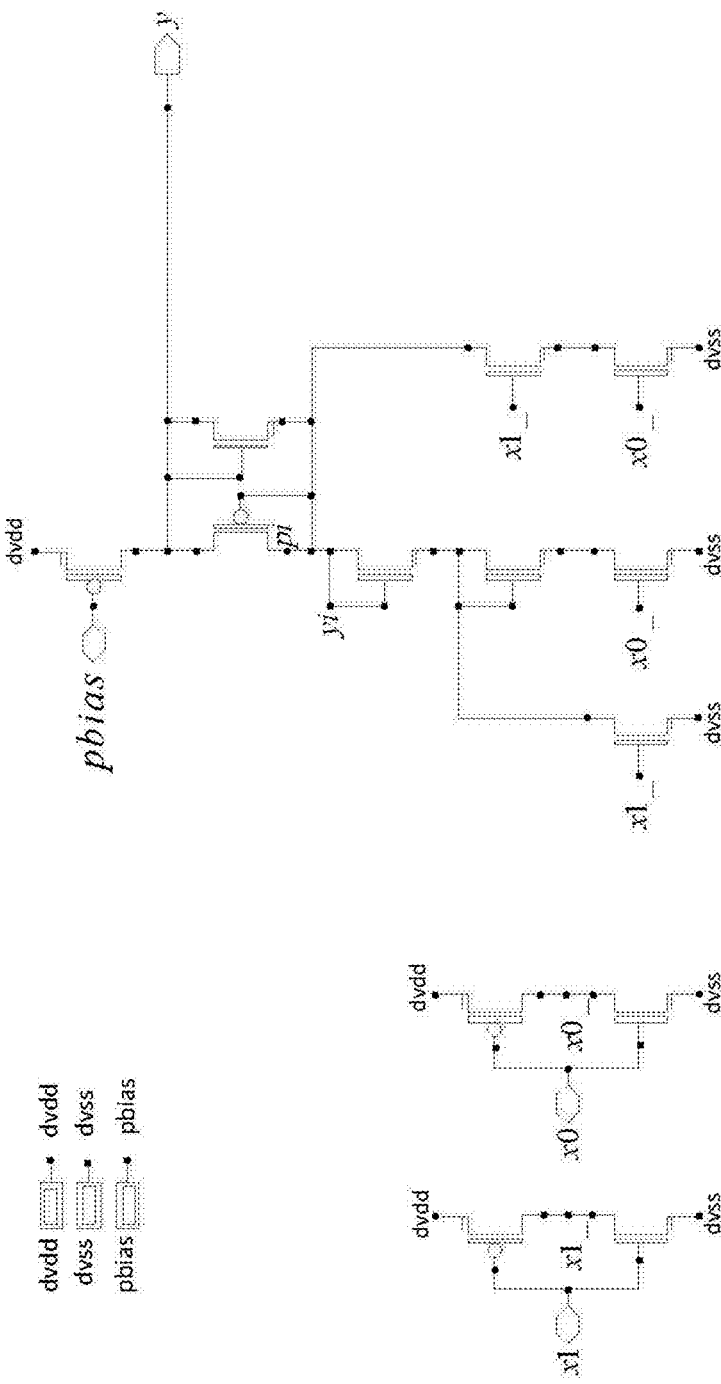
FIG. 17 is a circuit diagram of a binary to 4-level encoder.
Figure 18:
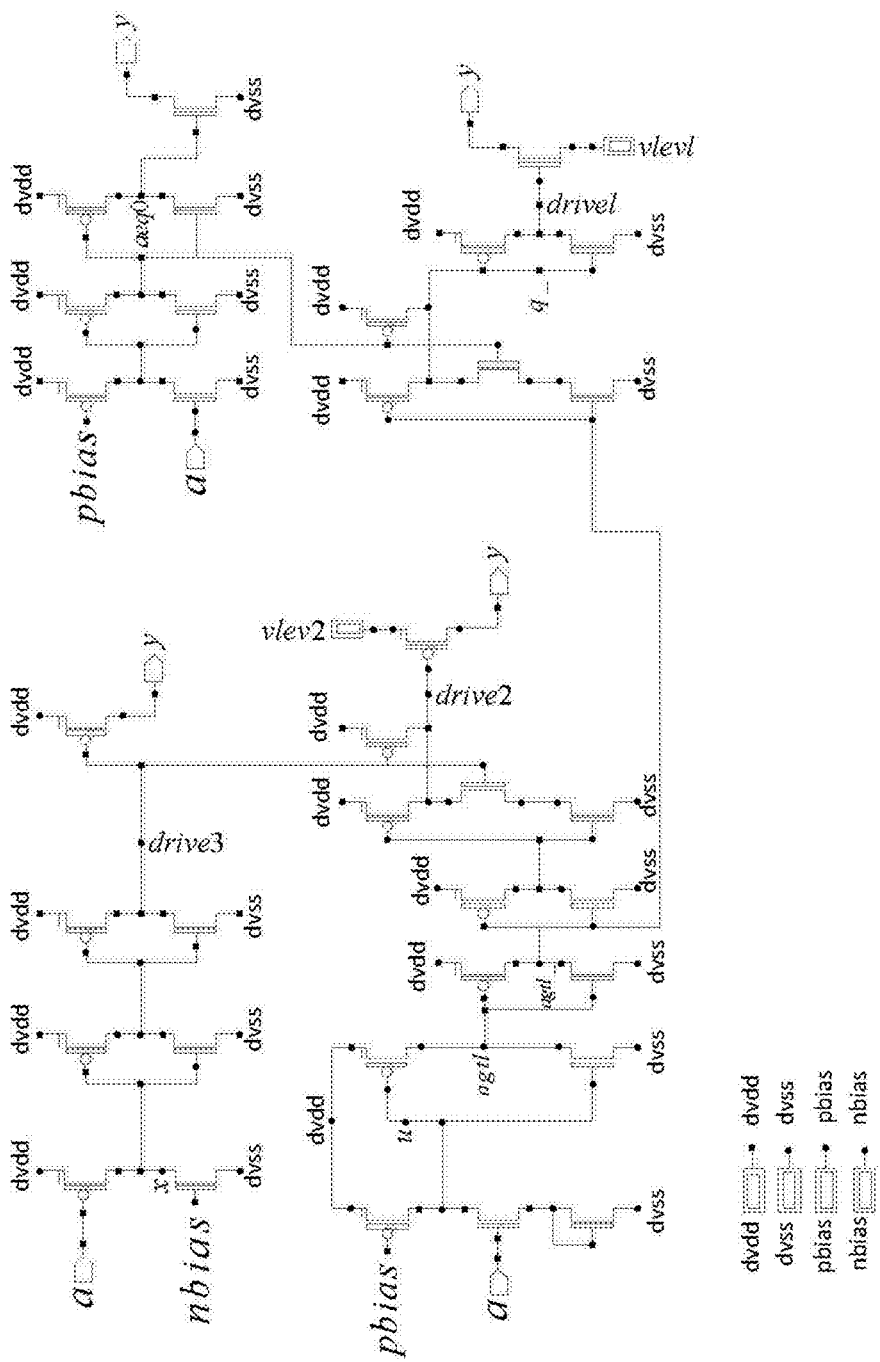
FIG. 18 is a circuit diagram that illustrates 4-level output driver circuits.

FIG. 15 is a schematic diagram of an embodiment of a simultaneous arithmetic logic unit ("SIMU-ALU") that operates using four logic levels. In the SIMU-ALU illustrated in FIG. 15, two four-level logic signal inputs A and B as shown at the left. An output labeled "sim_f[7:0]" is shown at the right. Below the SIMU-ALU there is shown a parallel arithmetic logic unit using conventional binary logic. The A and B inputs are decoded from 4-level logic states to binary logic using a 4-level to binary decoder illustrated in FIG. 16. The output of the parallel arithmetic logic unit using conventional binary logic is converted back to 4-level logic using the binary to 4-level encoder shown in FIG. 17. FIG. 18 is a circuit diagram that illustrates 4-level output driver circuits. The output of the parallel arithmetic logic unit using conventional binary logic (after being encoded) is labeled "bin_f[7:0]." The signal labeled S[7:0] is a selector signal that determines what logical operation the SIMU-ALU and the parallel arithmetic logic unit using conventional binary logic will perform. Decoders and encoders that decode or encode a number of logic states other than N=4 to or from binary states, respectively, are also contemplated.

FIG. 19 is a table that illustrates the values of the selector S and the corresponding logical operation that each of the SIMU-ALU and the parallel arithmetic logic unit using conventional binary logic will perform. In the table illustrated in FIG. 19, the logic function that is performed can be understood using positive logic, or negative logic.

Figure 20:
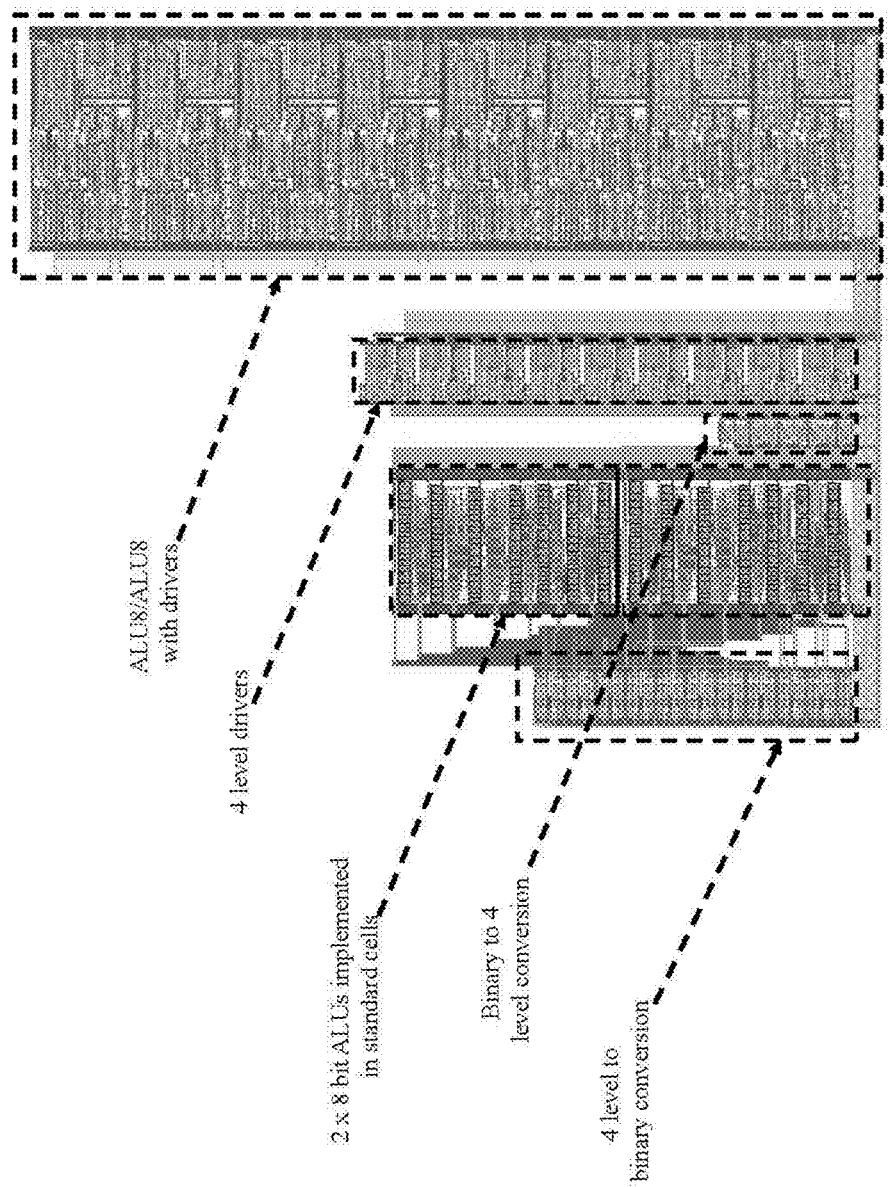
FIG. 20 is a diagram that illustrates a circuit layout for a device that operates according to principles of the invention that is illustrated by the schematic in FIG. 15.

Circuitry corresponding to the device shown in FIG. 15 has been fabricated and operated. A circuit layout for the device is illustrated in FIG. 20.

Figure 21:
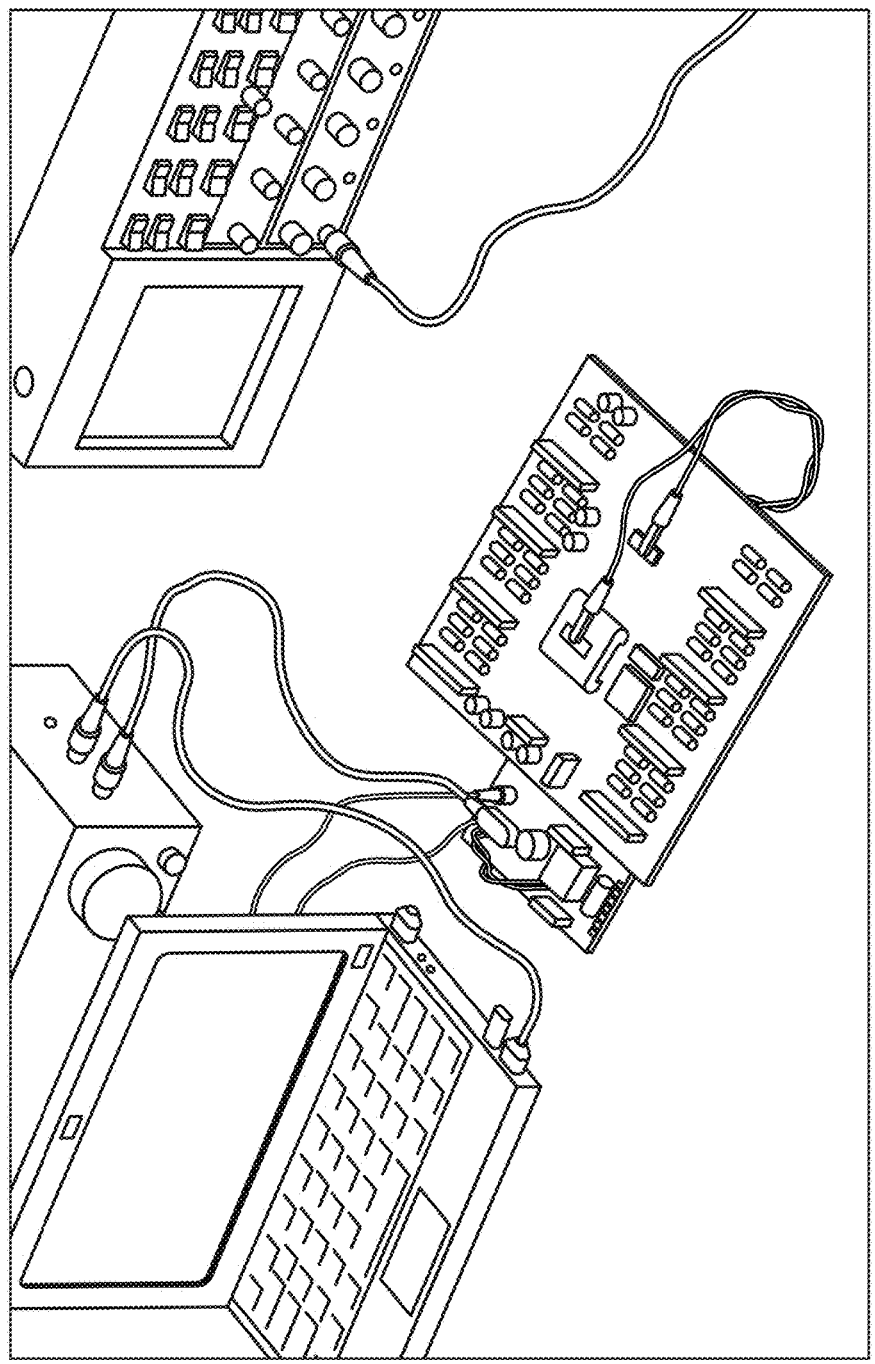
FIG. 21 is an image of the SIMU-ALU device being tested.

FIG. 21 is an image of the SIMU-ALU device being tested.

Figure 22:
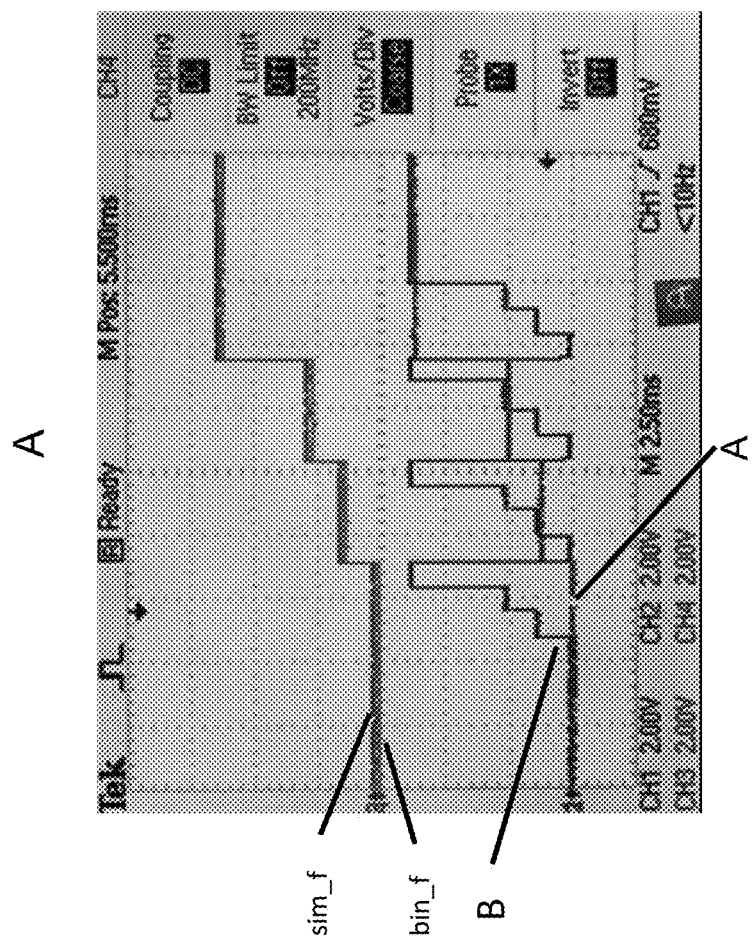
FIG. 22 is a graph showing A and B inputs for a logic function A (e.g., output=A input) that demonstrates the identity of output for the SIMU-ALU and the parallel arithmetic logic unit using conventional binary logic.

FIG. 22 is a graph showing A and B inputs for a logic function A (e.g., output=A input) that demonstrates the identity of output for the SIMU-ALU and the parallel arithmetic logic unit using conventional binary logic.

Figure 23:
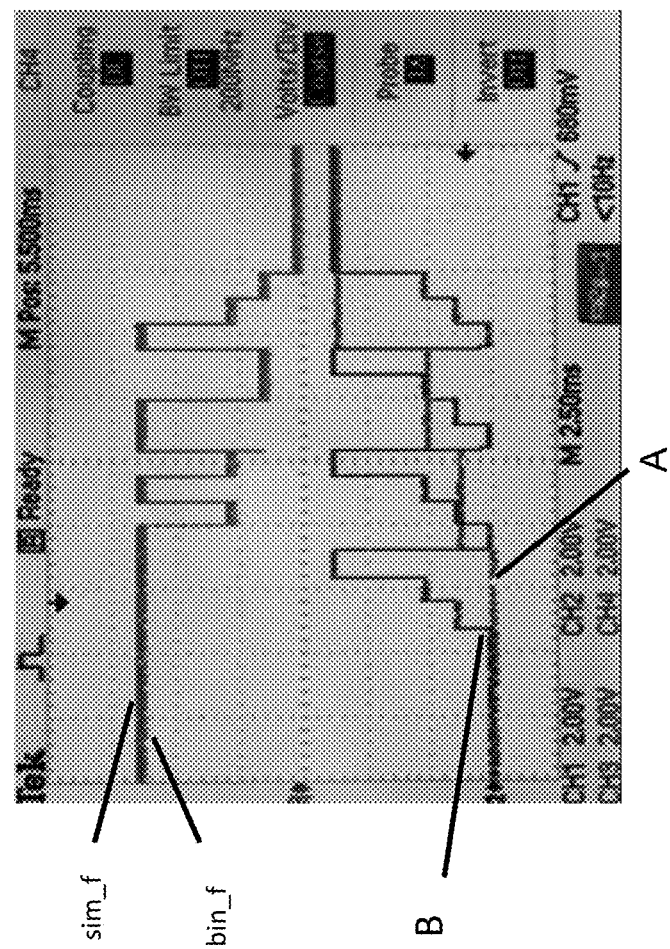
FIG. 23 is a graph showing A and B inputs for a logic function (A+B)−1 (e.g., output=NAND (A and B)) that demonstrates the identity of output for the SIMU-ALU and the parallel arithmetic logic unit using conventional binary logic.

FIG. 23 is a graph showing A and B inputs for a logic function (A+B)−1 (e.g., output=NAND (A and B) that demonstrates the identity of output for the SIMU-ALU and the parallel arithmetic logic unit using conventional binary logic. Upon comparison of FIG. 7C with FIG. 23, one sees that the actual output of the device is the same as the output expected from applying the NAND/NAND truth table.

While the description and embodiments provided here have been presented in terms of electronic devices, it is also contemplated that similar systems can be constructed using optical methods instead of electronic methods, in which the monotonic signal levels (such as voltages or currents) are replaced with monotonic optical signals, such as intensity of illumination signals, or are replaced with a plurality of closely spaced optical signals of known wavelengths, so that N monotonic levels can be distinguished.

Definitions

Unless otherwise explicitly recited herein, any reference to an electronic signal or an electromagnetic signal (or their equivalents) is to be understood as referring to a non-volatile electronic signal or a non-volatile electromagnetic signal.

Recording the results from an operation or data acquisition, such as for example, recording results at a particular frequency or wavelength, is understood to mean and is defined herein as writing output data in a non-transitory manner to a storage element, to a machine-readable storage medium, or to a storage device. Non-transitory machine-readable storage media that can be used in the invention include electronic, magnetic and/or optical storage media, such as magnetic floppy disks and hard disks; a DVD drive, a CD drive that in some embodiments can employ DVD disks, any of CD-ROM disks (i.e., read-only optical storage disks), CD-R disks (i.e., write-once, read-many optical storage disks), and CD-RW disks (i.e., rewriteable optical storage disks); and electronic storage media, such as RAM, ROM, EPROM, Compact Flash cards, PCMCIA cards, or alternatively SD or SDIO memory; and the electronic components (e.g., floppy disk drive, DVD drive, CD/CD-R/CD-RW drive, or Compact Flash/PCMCIA/SD adapter) that accommodate and read from and/or write to the storage media. Unless otherwise explicitly recited, any reference herein to "record" or "recording" is understood to refer to a non-transitory record or a non-transitory recording.

As is known to those of skill in the machine-readable storage media arts, new media and formats for data storage are continually being devised, and any convenient, commercially available storage medium and corresponding read/write device that may become available in the future is likely to be appropriate for use, especially if it provides any of a greater storage capacity, a higher access speed, a smaller size, and a lower cost per bit of stored information. Well known older machine-readable media are also available for use under certain conditions, such as punched paper tape or cards, magnetic recording on tape or wire, optical or magnetic reading of printed characters (e.g., OCR and magnetically encoded symbols) and machine-readable symbols such as one and two dimensional bar codes. Recording image data for later use (e.g., writing an image to memory or to digital memory) can be performed to enable the use of the recorded information as output, as data for display to a user, or as data to be made available for later use. Such digital memory elements or chips can be standalone memory devices, or can be incorporated within a device of interest. "Writing output data" or "writing an image to memory" is defined herein as including writing transformed data to registers within a microcomputer.

"Microcomputer" is defined herein as synonymous with microprocessor, microcontroller, and digital signal processor ("DSP"). It is understood that memory used by the microcomputer, including for example instructions for data processing coded as "firmware" can reside in memory physically inside of a microcomputer chip or in memory external to the microcomputer or in a combination of internal and external memory. Similarly, analog signals can be digitized by a standalone analog to digital converter ("ADC") or one or more ADCs or multiplexed ADC channels can reside within a microcomputer package. It is also understood that field programmable array ("FPGA") chips or application specific integrated circuits ("ASIC") chips can perform microcomputer functions, either in hardware logic, software emulation of a microcomputer, or by a combination of the two. Apparatus having any of the inventive features described herein can operate entirely on one microcomputer or can include more than one microcomputer.

General purpose programmable computers useful for controlling instrumentation, recording signals and analyzing signals or data according to the present description can be any of a personal computer (PC), a microprocessor based computer, a portable computer, or other type of processing device. The general purpose programmable computer typically comprises a central processing unit, a storage or memory unit that can record and read information and programs using machine-readable storage media, a communication terminal such as a wired communication device or a wireless communication device, an output device such as a display terminal, and an input device such as a keyboard. The display terminal can be a touch screen display, in which case it can function as both a display device and an input device. Different and/or additional input devices can be present such as a pointing device, such as a mouse or a joystick, and different or additional output devices can be present such as an enunciator, for example a speaker, a second display, or a printer. The computer can run any one of a variety of operating systems, such as for example, any one of several versions of Windows, or of MacOS, or of UNIX, or of Linux. Computational results obtained in the operation of the general purpose computer can be stored for later use, and/or can be displayed to a user. At the very least, each microprocessor-based general purpose computer has registers that store the results of each computational step within the microprocessor, which results are then commonly stored in cache memory for later use.

Many functions of electrical and electronic apparatus can be implemented in hardware (for example, hard-wired logic), in software (for example, logic encoded in a program operating on a general purpose processor), and in firmware (for example, logic encoded in a non-volatile memory that is invoked for operation on a processor as required). The present invention contemplates the substitution of one implementation of hardware, firmware and software for another implementation of the equivalent functionality using a different one of hardware, firmware and software. To the extent that an implementation can be represented mathematically by a transfer function, that is, a specified response is generated at an output terminal for a specific excitation applied to an input terminal of a "black box" exhibiting the transfer function, any implementation of the transfer function, including any combination of hardware, firmware and software implementations of portions or segments of the transfer function, is contemplated herein, so long as at least some of the implementation is performed in hardware.

Theoretical Discussion

Although the theoretical description given herein is thought to be correct, the operation of the devices described and claimed herein does not depend upon the accuracy or validity of the theoretical description. That is, later theoretical developments that may explain the observed results on a basis different from the theory presented herein will not detract from the inventions described herein.

Any patent, patent application, or publication identified in the specification is hereby incorporated by reference herein in its entirety. Any material, or portion thereof, that is said to be incorporated by reference herein, but which conflicts with existing definitions, statements, or other disclosure material explicitly set forth herein is only incorporated to the extent that no conflict arises between that incorporated material and the present disclosure material. In the event of a conflict, the conflict is to be resolved in favor of the present disclosure as the preferred disclosure.

While the present invention has been particularly shown and described with reference to the preferred mode as illustrated in the drawing, it will be understood by one skilled in the art that various changes in detail may be affected therein without departing from the spirit and scope of the invention as defined by the claims.

What is claimed is:

1. A logic gate comprising:
a decoder;
a plurality of Boolean gates; and
an encoder;
where the logic gate:
determines a logic level selected from at least three input logic levels based on a first voltage scale of a received input signal using the decoder;
determines a Boolean output by transmitting the logic level through the plurality of Boolean gates; and
determines an output logic level selected from at least three output logic levels based on a second voltage scale using the Boolean output transmitted to the encoder.

2. The logic gate of claim 1, wherein the decoder decodes the logic level into a set of binary values.

3. The logic gate of claim 1, wherein the first voltage scale is the same as the second voltage scale.

4. The logic gate of claim 1, wherein the first voltage scale is not the same as the second voltage scale.

5. The logic gate of claim 1, wherein the first voltage scale is a sequence of monotonically increasing voltage levels.

6. The logic gate of claim 1, wherein the first voltage scale is a sequence of equally spaced voltage levels.

7. The logic gate of claim 1, wherein the second voltage scale is a sequence of monotonically increasing voltage levels.

8. The logic gate of claim 1, wherein the second voltage scale is a sequence of equally spaced voltage levels.

9. The logic gate of claim 1, wherein the at least three input logic levels have four states.

10. The logic gate of claim 1, wherein the Boolean gates simultaneously determine the Boolean output.

11. The logic gate of claim 1, wherein the logic levels are transmitted to the plurality of Boolean gates on a plurality of separate channels.

12. The logic gate of claim 11, wherein each channel in the plurality of separate channel transmits a portion of the Boolean output to the encoder.

13. The logic gate of claim 1, wherein the Boolean gates are selected from the group consisting of AND, OR, XOR, NAND, NOR, and NAND3.

* * * * *